United States Patent
Jeon et al.

(10) Patent No.: US 11,600,671 B2
(45) Date of Patent: *Mar. 7, 2023

(54) ELECTRONIC PANEL AND ELECTRONIC APPARATUS INCLUDING THE SAME

(71) Applicant: Samsung Display Co., LTD., Yongin-si (KR)

(72) Inventors: Byeongguk Jeon, Daegu (KR); Dong-Hyun Lee, Suwon-si (KR); Deok-Young Choi, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/471,285

(22) Filed: Sep. 10, 2021

(65) Prior Publication Data
US 2021/0408141 A1 Dec. 30, 2021

Related U.S. Application Data

(63) Continuation of application No. 16/813,685, filed on Mar. 9, 2020, now Pat. No. 11,121,193.

(30) Foreign Application Priority Data
Apr. 8, 2019 (KR) .................. 10-2019-0040674

(51) Int. Cl.
*H01L 27/32* (2006.01)
*G06F 3/044* (2006.01)

(52) U.S. Cl.
CPC .......... *H01L 27/323* (2013.01); *G06F 3/0445* (2019.05); *H01L 27/3276* (2013.01)

(58) Field of Classification Search
CPC ............... H01L 27/323; H01L 27/3276; H01L 27/3297; G06F 3/044; G06F 3/0443;
(Continued)

(56) References Cited

U.S. PATENT DOCUMENTS 10,739,931 B2 * 8/2020 Kim .................... G06F 3/04164
10,790,342 B2 * 9/2020 Han .................... G06F 3/0446
(Continued)

FOREIGN PATENT DOCUMENTS

KR 10-2015-0077831 7/2015
KR 10-2018-0014384 2/2018
(Continued)

OTHER PUBLICATIONS

Non-Final Office Action dated Nov. 20, 2020, in U.S. Appl. No. 16/813,685.
(Continued)

*Primary Examiner* — Tom V Sheng
(74) *Attorney, Agent, or Firm* — H.C. Park & Associates, PLC

(57) ABSTRACT

An electronic panel may include a plurality of sensing electrodes and a plurality of sensing lines. The sensing lines may include a plurality of first group sensing lines and a plurality of second group sensing lines, which are spaced apart from each other in a specific direction and are alternately arranged with respect to each other. Each of the first group sensing lines and the second group sensing lines may include a first pattern layer and a second pattern layer, which are spaced apart from each other with an insulating layer interposed therebetween and are coupled to each other through the insulating layer. Each of the first group sensing lines may include a first pattern layer in a specific region, and each of the second group sensing lines may include a second pattern layer in the specific region.

20 Claims, 13 Drawing Sheets

(58) Field of Classification Search
CPC .... G06F 3/0445; G06F 3/0446; G06F 3/0448; G06F 2203/04111
USPC ........................................................ 345/174
See application file for complete search history.

(56) References Cited

U.S. PATENT DOCUMENTS

| | | |
|---|---|---|
| 11,121,193 B2 * | 9/2021 | Jeon ...................... H01L 27/323 |
| 2018/0033831 A1 | 2/2018 | An et al. |
| 2018/0151662 A1 | 5/2018 | Rhe et al. |
| 2018/0286938 A1 | 10/2018 | Moon et al. |
| 2019/0294278 A1 | 9/2019 | Kim et al. |
| 2020/0110498 A1 | 4/2020 | Lee et al. |
| 2020/0111843 A1 | 4/2020 | Han et al. |
| 2020/0176657 A1 | 6/2020 | Jang et al. |
| 2020/0241705 A1 | 7/2020 | Kim et al. |
| 2020/0266255 A1 | 8/2020 | Jung et al. |
| 2021/0173518 A1 * | 6/2021 | Moon .................... G06F 3/0446 |
| 2021/0247866 A1 * | 8/2021 | Kim .................... G06F 3/04164 |

FOREIGN PATENT DOCUMENTS

| | | |
|---|---|---|
| KR | 10-2018-0059633 | 6/2018 |
| KR | 10-2018-0112203 | 10/2018 |

OTHER PUBLICATIONS

Notice of Allowance dated May 5, 2021, in U.S. Appl. No. 16/813,685.

* cited by examiner

ELECTRONIC PANEL AND ELECTRONIC APPARATUS INCLUDING THE SAME

CROSS REFERENCE TO RELATED APPLICATIONS

This application claims priority from and the benefit of Korean Patent Application No. 10-2019-0040674, filed on Apr. 8, 2019, which is hereby incorporated by reference for all purposes as if fully set forth herein.

BACKGROUND

Field

Exemplary embodiments of the invention relate generally to an electronic panel and an electronic apparatus including the same and, more specifically, to an electronic panel including a display unit and an input sensing unit and an electronic apparatus including the same.

Discussion of the Background

An electronic apparatus may activated by an electrical signal. The electronic apparatus can include various electronic components, such as a display unit for displaying an image or an input sensing unit for sensing an external input. The electronic components are electrically connected to each other through signal lines, which can be arranged in various configurations.

The display unit can include an emission device configured to produce an image. The input sensing unit can include sensing electrodes for sensing an external input. In the case where an electronic apparatus includes a single panel, in which both of the display unit and the input sensing unit are disposed, it is possible to simplify an assembling process, owing to its simple structure. However, since the display unit and the input sensing unit are formed in a single panel, the process suffers from high complexity and low reliability.

The above information disclosed in this Background section is only for understanding of the background of the inventive concepts, and, therefore, it may contain information that does not constitute prior art.

SUMMARY

Apparatuses constructed according to exemplary embodiments of the invention are capable of providing a highly-reliable electronic panel including a sensing unit and a display unit and an electronic apparatus including the same.

Additional features of the inventive concepts will be set forth in the description which follows, and in part will be apparent from the description, or may be learned by practice of the inventive concepts.

According to an exemplary embodiment of the inventive concepts, an electronic apparatus may include a display unit including a base substrate, which includes an active region and a peripheral region adjacent to the active region, a plurality of emission devices, which are disposed on the active region, and an encapsulation layer, which covers the emission devices, and an input sensing unit including a plurality of sensing electrodes, which are disposed on the display unit and are overlapped with the active region, and a plurality of sensing lines, which are disposed on the peripheral region, are electrically connected to the sensing electrodes, respectively, and are arranged in a specific direction in a specific region. Each of the sensing lines may include a first pattern layer and a second pattern layer, which is disposed on a layer different from the first pattern layer and coupled to the first pattern layer. The sensing lines may include first group sensing lines, each of which has a single-layered structure, in which the first pattern layer of the first and second pattern layers is selectively disposed, in the specific region, and second group sensing lines, each of which has a single-layered structure, in which the second pattern layer of the first and second pattern layers is selectively disposed, in the specific region. The first group sensing lines and the second group sensing lines may be alternately arranged in the specific direction.

In an embodiment, the first pattern layers of each of the first group sensing lines may be extended in a direction crossing the specific direction to cross the specific region, and the second pattern layers of each of the first group sensing lines may include first end portions, which are cut in the specific region. The second pattern layers of each of the second group sensing lines may be extended in the direction crossing the specific direction to cross the specific region, and the first pattern layers of each of the second group sensing lines may include second end portions, which are cut in the specific region.

In an embodiment, the first end portions and the second end portions may be aligned in the specific direction.

In an embodiment, the first end portions may be arranged to be misaligned to the second end portions in the specific direction.

In an embodiment, the display unit may further include a structure pattern disposed in the specific region, and the structure pattern may include a recess region or a protruding portion.

In an embodiment, the display unit may provide a non-flat surface, which corresponds to a shape of the structure pattern, to the specific region.

In an embodiment, the encapsulation layer may cover the structure pattern to provide a flat surface to the specific region.

In an embodiment, the first pattern layer and the second pattern layer may have substantially the same width in the specific direction.

In an embodiment, the first pattern layer and the second pattern layer may have different widths from each other, in the specific direction.

In an embodiment, the first pattern layer and the second pattern layer may have substantially the same resistance.

In an embodiment, the first pattern layer of the first group sensing line and the second pattern layer of the second group sensing line may be spaced apart from each other, when viewed in a plan view.

In an embodiment, the first pattern layer of the first group sensing line and the second pattern layer of the second group sensing line may be partially overlapped with each other, when viewed in a plan view.

In an embodiment, each of the sensing electrodes may include a first sensing electrode including a plurality of first sensing patterns and a plurality of first connection patterns, which connect the first sensing patterns to each other, and a second sensing electrode including a plurality of second sensing patterns, which are spaced apart from the first sensing patterns, and a plurality of second connection patterns, which are spaced apart from the first connection patterns with an insulating layer interposed therebetween and connect the second sensing patterns to each other. The first pattern layer and the second pattern layer may be spaced apart from each other, with the insulating layer interposed therebetween.

According to an exemplary embodiment of the inventive concepts, an electronic panel may include a base layer including a plurality of emission devices, which are disposed in an active region, and a structure pattern, which is disposed in a peripheral region adjacent to the active region and includes an insulating material, a plurality of sensing electrodes disposed on the base layer and in the active region, and a plurality of sensing lines disposed on the base layer and in the peripheral region and electrically connected to the sensing electrodes, respectively. The sensing lines may include a plurality of first group sensing lines, which are spaced apart from each other in a specific direction, and a plurality of second group sensing lines, which are respectively disposed between the first group sensing lines and are spaced apart from each other in the specific direction. Each of the first group sensing lines and the second group sensing lines may include a first pattern layer and a second pattern layer, which are spaced apart from each other with an insulating layer interposed therebetween and are coupled to each other through the insulating layer. Each of the first group sensing lines may include only the first pattern layer of the first and second pattern layers, in a specific region. Each of the second group sensing lines may include only the second pattern layer of the first and second pattern layers, in the specific region.

In an embodiment, the structure pattern may include a recess region or protruding portion extending in the specific direction, and the base layer may provide a non-flat surface to the specific region.

In an embodiment, the base layer may further include an organic layer covering the structure pattern, and the organic layer may provide a flat surface to the specific region.

In an embodiment, the first pattern layer and the second pattern layer may be spaced apart from each other, in the specific region, when viewed in a plan view.

In an embodiment, the first pattern layer and the second pattern layer may be partially overlapped with each other, in the specific region, when viewed in a plan view.

In an embodiment, a coupling portion between the first pattern layer and the second pattern layer may be spaced apart from the specific region.

In an embodiment, each of the sensing electrodes may include a first sensing electrode including a plurality of first sensing patterns and a plurality of first connection patterns, which are disposed between the first sensing patterns to connect adjacent patterns of the first sensing patterns to each other, and a second sensing electrode including a plurality of second connection patterns, which are spaced apart from the first connection patterns with the insulating layer interposed therebetween, and a plurality of second sensing patterns, which are spaced apart from the first sensing patterns and are connected to each other by the second connection patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Figure 1A:
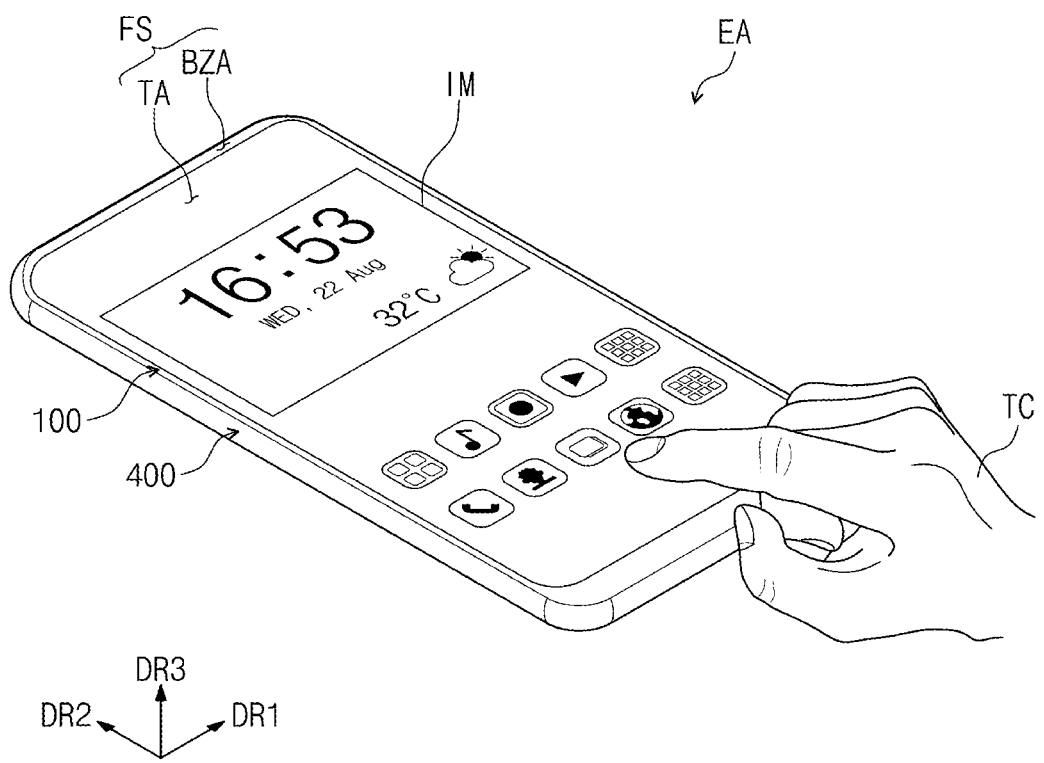
FIG. 1A is a perspective view illustrating an electronic apparatus according to an exemplary embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words, and are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions of the elements, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When a layer or an element is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements' relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
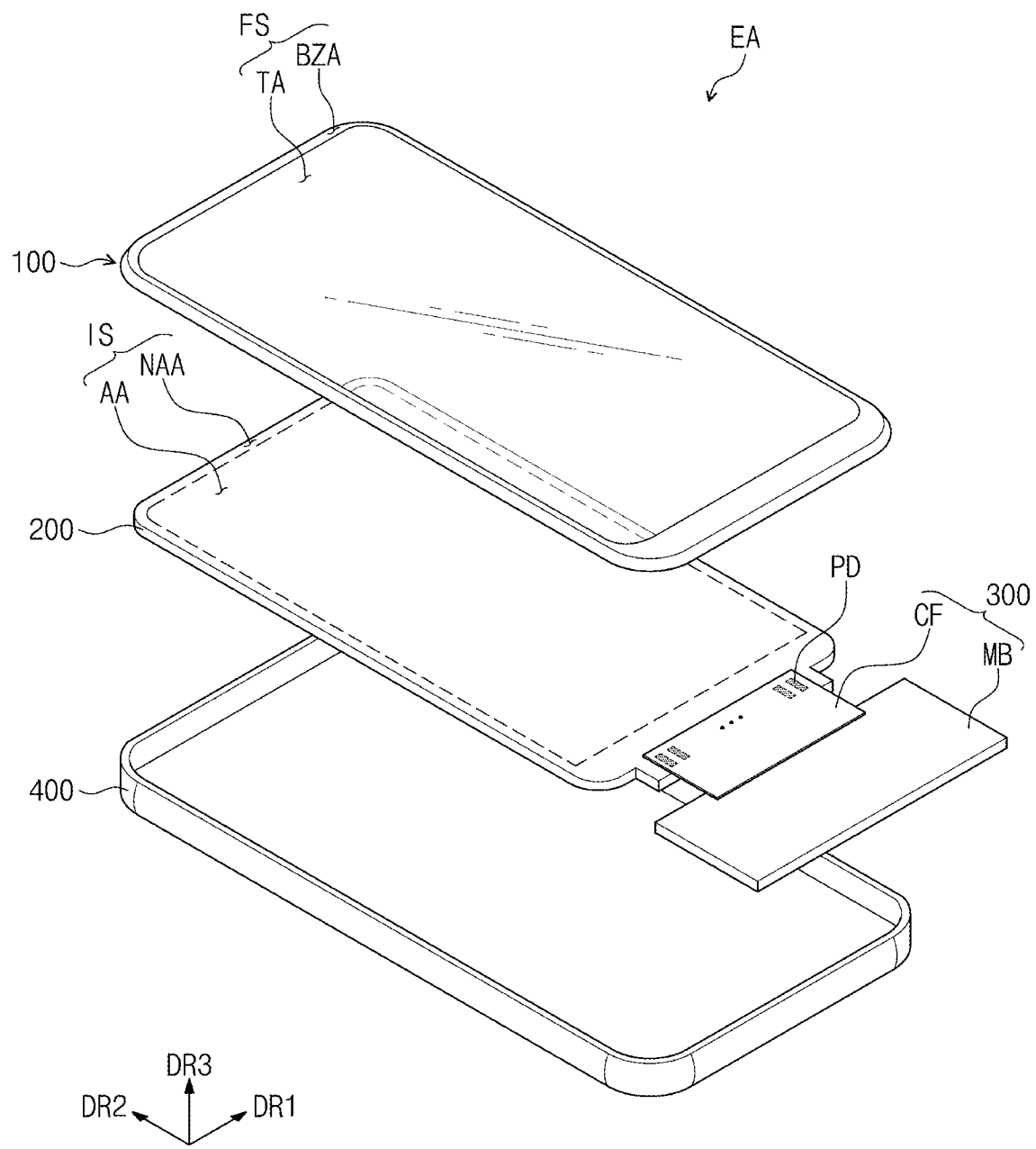
FIG. 1B is an exploded perspective view of the electronic apparatus of FIG. 1A.
Figure 2A:
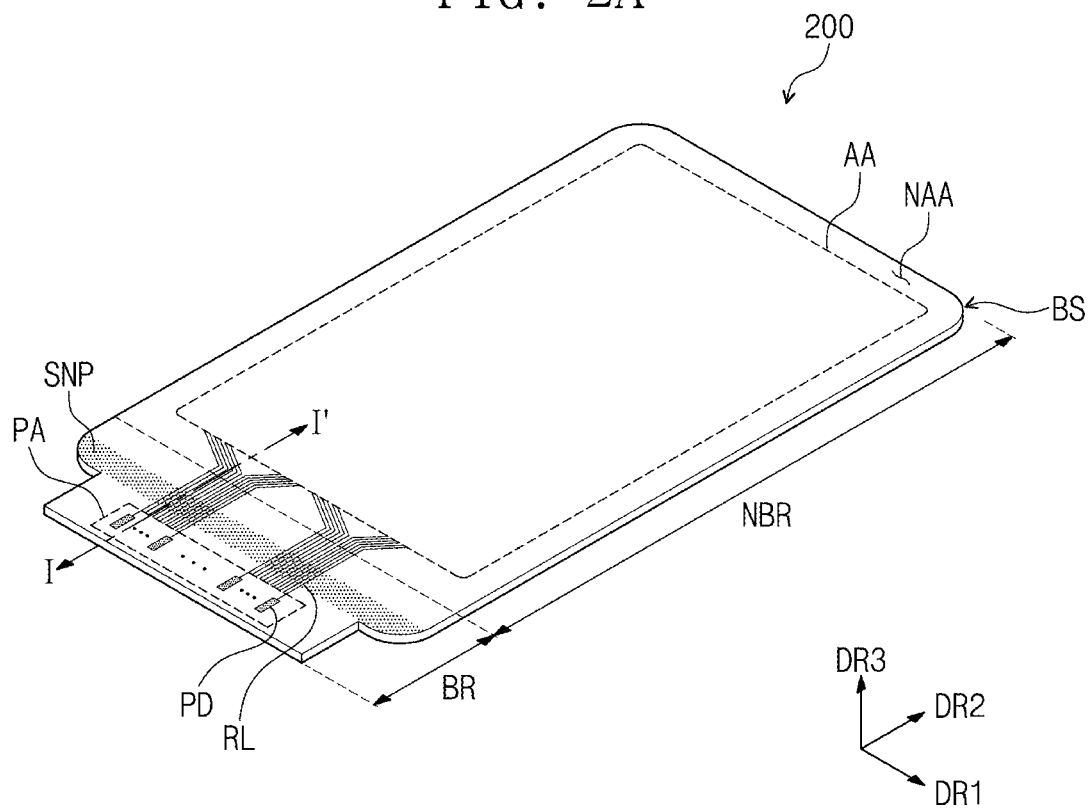
FIGS. 2A and 2B are perspective views illustrating some elements constituting the electronic apparatus of FIG. 1B.
Figure 2B:
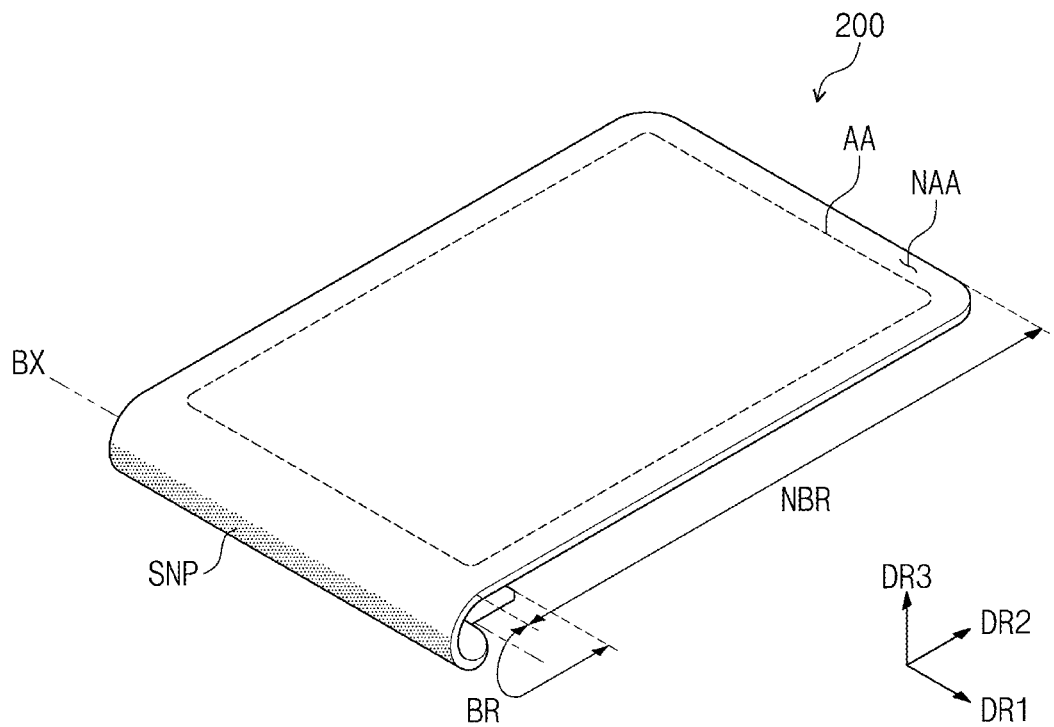
Figure 2C:
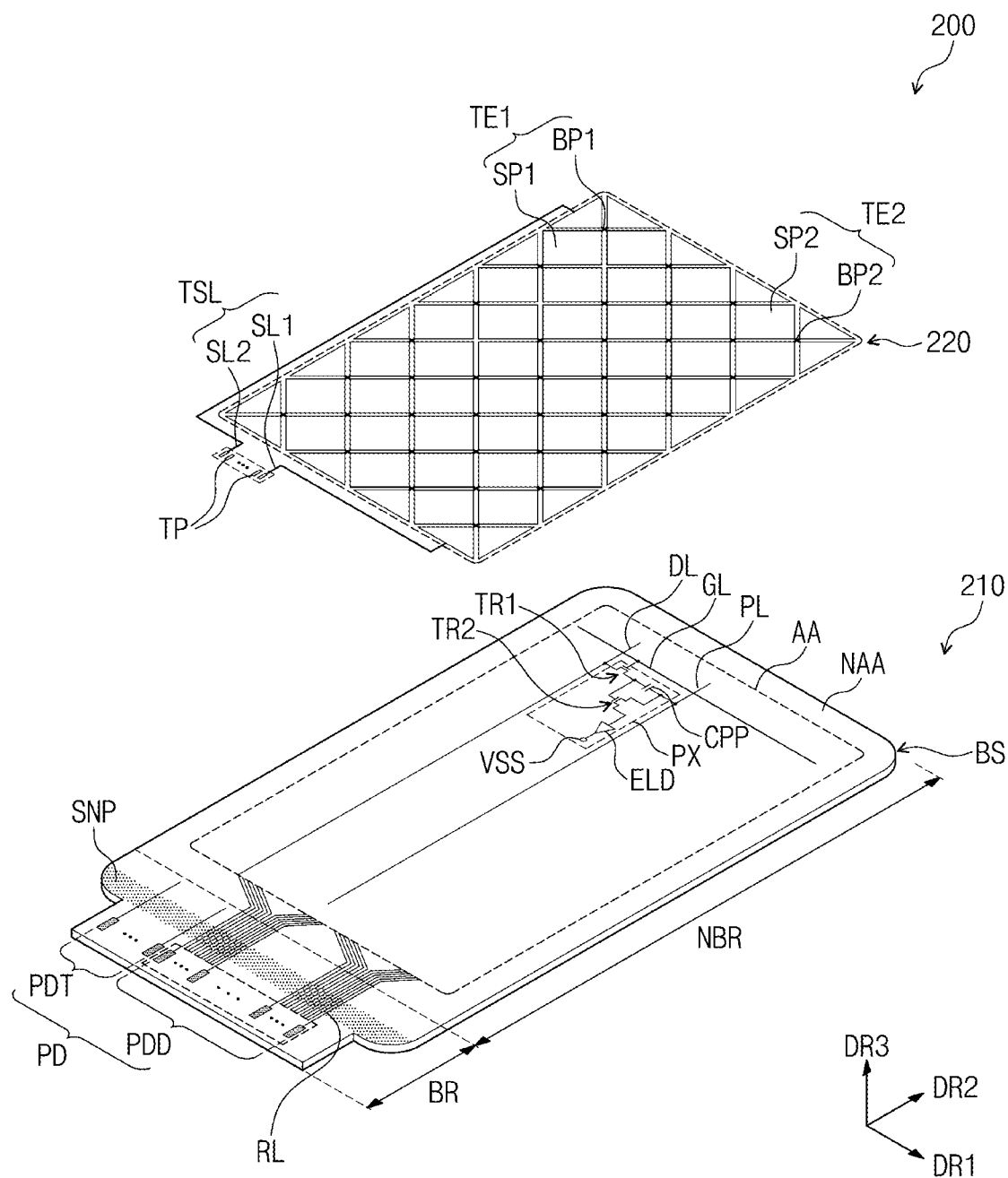
FIG. 2C is an exploded perspective view of an electronic panel according to an exemplary embodiment of the inventive concepts.

FIG. 1A is a perspective view illustrating an electronic apparatus according to an embodiment of the inventive concepts. FIG. 1B is an exploded perspective view of the electronic apparatus of FIG. 1A. FIGS. 2A and 2B are perspective views illustrating some elements constituting the electronic apparatus of FIG. 1B. FIG. 2C is an exploded perspective view of an electronic panel according to an embodiment of the inventive concepts. Hereinafter, an embodiment of the inventive concepts will be described with reference to FIGS. 1A to 2C.

As shown in FIGS. 1A and 1B, an electronic apparatus EA may include a front surface FS, which is used to display an image IM. The front surface FS may be defined to be parallel to a plane defined by a first direction DR1 and a second direction DR2. The front surface FS may include a transmission region TA and a bezel region BZA adjacent to the transmission region TA.

The electronic apparatus EA may display the image IM in the transmission region TA. The image IM may be at least one of still images and moving images. FIG. 1A illustrates a clock and a plurality of icons as an example of the image IM.

The transmission region TA is illustrated to have a rectangular shape, which have sides parallel to the first and second directions DR1 and DR2 and have rounded corners. However, the inventive concepts are not limited to this example or a specific embodiment, and in an embodiment, the shape of the transmission region TA may be variously changed.

The bezel region BZA may be disposed adjacent to the transmission region TA. The bezel region BZA may have a predetermined color. The bezel region BZA may enclose the transmission region TA. However, the inventive concepts are not limited to this example, and in an embodiment, the bezel region BZA may be disposed adjacent to one of side regions of the transmission region TA or may be omitted. The inventive concepts are not limited to a specific structure of the electronic apparatus EA, and the structure of the electronic apparatus EA may be variously changed.

Hereinafter, a direction normal to the front surface FS will be referred to as a thickness direction of the electronic apparatus EA or a third direction DR3. In the present specification, a front or top surface and a rear or bottom surface of each element or member may be distinguished from each other, based on the third direction DR3 or a display direction of the image IM. For example, the front and rear surfaces of each of members may be opposite to each other in the third direction DR3. Directions indicated by the first to third directions DR1, DR2, and DR3 may be relative concepts, and in certain embodiments, they may be used to indicate other directions. Hereinafter, first to third directions may be directions indicated by the first to third directions DR1, DR2, and DR3, respectively, and will be referenced with the same numerals.

The electronic apparatus EA may sense a user's input TC (also may be referred to as "external input TC") provided from the outside. The user's input TC may include various types of external inputs, such as a part of a user's body, light, heat, or pressure. In addition, the electronic apparatus EA may sense an input that is in contact therewith or close thereto.

In the present embodiment, the user's input TC may be input to the front surface FS through a user's hand, as shown in FIG. 1A. However, the inventive concepts are not limited to this example, and in an embodiment, as described above, the user's input TC may be provided in various forms. Furthermore, depending on the structure of the electronic apparatus EA, the electronic apparatus EA may sense the user's input TC, which is applied through a side or rear surface of the electronic apparatus EA, but the inventive concepts are not limited to a specific embodiment.

As shown in FIG. 1B, the electronic apparatus EA may include a window 100, an electronic panel 200, a circuit substrate 300, and an outer case 400. The window 100 and the outer case 400 may be combined to each other to define an outer appearance of the electronic apparatus EA.

The window 100 may be disposed on the electronic panel 200 to cover a front surface IS of the electronic panel 200. The window 100 may include an optically transparent insulating material. For example, the window 100 may be formed of or include glass or plastic. The window 100 may have a multi- or single-layered structure. For example, the window 100 may have a stacking structure including a plurality of plastic films, which are coupled to each other by an adhesive layer, or may have a stacking structure including a glass substrate and a plastic film, which are coupled to each other by an adhesive layer.

The window 100 may include the front surface FS exposed to the outside. The front surface FS of the electronic apparatus EA may be substantially defined by the front surface FS of the window 100.

In detail, the transmission region TA may be an optically transparent region. The transmission region TA may have a shape corresponding to an active region AA. For example, the transmission region TA may be overlapped with a front surface or at least a portion of the active region AA. The image IM, which is displayed in the active region AA of the electronic panel 200, may be provided to a user through the transmission region TA.

The bezel region BZA may have relatively low optical transmittance, compared with the transmission region TA. The bezel region BZA may define a shape of the transmission region TA. The bezel region BZA may be adjacent to the transmission region TA and may enclose the transmission region TA.

The bezel region BZA may have a predetermined color. In the case where the window 100 is provided in the form of a glass or plastic substrate, the bezel region BZA may be a region, which is formed by a color layer printed or deposited on a surface of the glass or plastic substrate. In certain embodiments, the bezel region BZA may be formed by coloring a corresponding region of the glass or plastic substrate.

The bezel region BZA may cover a peripheral region NAA of the electronic panel 200 and may prevent the peripheral region NAA from being recognized by a user. However, the inventive concepts are not limited to this example, and in an embodiment, the bezel region BZA may be omitted from the electronic apparatus EA.

The electronic panel 200 may display the image IM and sense an external input TC. The electronic panel 200 may include the active region AA and the peripheral region NAA, which are separated from each other when viewed in a plan view. The active region AA may be a region that is activated according to an electrical signal. In the present embodiment, the active region AA may be a region, which is used to display the image IM and to sense the external input TC. However, the inventive concepts are not limited to this example or a specific embodiment, and in an embodiment, the active region AA may be divided into a region for displaying the image IM and another region for sensing the external input TC.

The peripheral region NAA may be adjacent to the active region AA. The peripheral region NAA may enclose a border of the active region AA. However, the inventive concepts are not limited to this example or a specific embodiment, and in an embodiment, the peripheral region NAA may be adjacent to a portion of the border of the active region AA.

Various signal lines GL, DL, and PL or pads PD (see FIG. 2C), which are used to provide electrical signals to the active region AA, or electronic components may be disposed in the peripheral region NAA. The peripheral region NAA may be covered with the bezel region BZA and may not be recognized by a user.

In an embodiment, the electronic panel 200 may include a bendable or foldable portion. For example, as shown in FIGS. 2A and 2B, the electronic panel 200 may include a non-bending portion NBR and a bending portion BR. FIG. 2A illustrates the electronic panel 200, which is in a non-bent state, and FIG. 2B illustrates the electronic panel 200, which is in a bent state.

The bending portion BR may be bent along a bending axis BX extending in the first direction DR1 by an external force. The bending axis BX may be defined on a rear surface of the electronic panel 200.

In an embodiment, the electronic panel 200 may further include a stress relieving pattern SNP, which is disposed in the bending portion BR. The stress relieving pattern SNP may be disposed between the active region AA and a pad region PA, in which the pads PD are disposed. The stress relieving pattern SNP may include an organic material. The stress relieving pattern SNP may prevent the bending portion BR from being damaged by a bending stress, which may occur when the bending portion BR is bent.

Since the bending portion BR is bent to enclose the bending axis BX, an area of the peripheral region NAA seen from the front surface FS of the window 100 may be decreased. Thus, the bezel region BZA may be decreased to improve the aesthetic quality of the electronic apparatus EA. However, the inventive concepts are not limited to this example, and in an embodiment, the bending portion BR may be omitted from the electronic panel 200.

As shown in FIG. 2C, the electronic panel 200 may include a display unit 210 and an input sensing unit 220. To provide better understanding of the structure of the electronic panel 200, FIG. 2C illustrates the display unit 210 and the input sensing unit 220, which are separated from each other.

The display unit 210 may produce and display the image IM in the active region AA. The display unit 210 may include a base substrate BS, a plurality of signal lines GL, DL, PL, and RL, a pixel PX, and a gate driving circuit (not shown).

The base substrate BS may have a planar shape corresponding to that of the electronic panel 200. In detail, the base substrate BS may be an element, which does substantially provide the bending portion BR and the non-bending portion NBR. The base substrate BS may be flexible and thus may be bent. For example, the base substrate BS may be an insulating polymer film.

The signal lines GL, DL, PL, and RL may be disposed on the base substrate BS. The signal lines GL, DL, PL, and RL may include a gate line GL, a data line DL, a power line PL, and routing lines RL. The gate line GL, the data line DL, and the power line PL may be used to transmit electrical signals, which are different from each other.

The gate line GL may extend in the first direction DR1. In an embodiment, a plurality of the gate lines GL may be arranged to be spaced apart from each other in the second direction DR2, but for convenience in illustration, only one of the gate lines GL is exemplarily illustrated in FIG. 2C. The gate line GL may be used to transmit gate signals, which are produced in a gate driving circuit (not shown), to the pixel PX.

The data line DL may extend in the second direction DR2. The data line DL may be electrically disconnected from the gate line GL. In an embodiment, a plurality of the data lines DL may be arranged to be spaced apart from each other in the first direction DR1, but for convenience in illustration, only one of the data lines DL is exemplarily illustrated in FIG. 2C. The data line DL may be used to transmit data signals to the pixel PX.

The power line PL may extend in the second direction DR2. The power line PL may be electrically disconnected from the gate line GL and the data line DL. In an embodiment a plurality of the power lines PL may be arranged to be spaced apart from each other in the first direction DR1, but for convenience in illustration, only one of the power lines PL is exemplarily illustrated in FIG. 2C. The power line PL may be used to transmit a power signal (hereinafter, a first power signal) to the pixel PX.

The routing lines RL may be disposed in the peripheral region NAA. The routing lines RL may be overlapped with the stress relieving pattern SNP, when viewed in a plan view. The routing lines RL may connect the pads PD to respective signal lines corresponding to the pads PD. The signal lines may include the data line DL, the gate line GL, a line connected to the gate driving circuit, a line connected to the power line PL, or the like. However, the inventive concepts are not limited to this example or a specific embodiment, and in an embodiment, at least one of the routing lines RL and at least one signal line corresponding thereto may be connected to form a single object.

The pixel PX may emit light constituting the image IM, in response to electrical signals. FIG. 2C illustrates an example of an equivalent circuit diagram of one pixel PX. In an embodiment, a plurality of the pixels PX may be provided, but for convenience in illustration, just one of the pixels PX is exemplarily illustrated in FIG. 2C. In certain embodiments, the circuit structure of the pixel PX may be variously changed, and the inventive concepts are not limited to a specific embodiment.

The pixel PX may include a first thin film transistor TR1, a second thin film transistor TR2, a capacitor CPP, and an emission device ELD. The first thin film transistor TR1, the second thin film transistor TR2, the capacitor CPP, and the emission device ELD may be electrically connected to each other.

The first thin film transistor TR1 may be a switching device configured to control the on/off operation of the pixel PX. The first thin film transistor TR1 may be connected to the gate line GL and the data line DL. The first thin film transistor TR1 may be turned on by the gate signal, which is transmitted through the gate line GL, and in this case, the data signal, which is transmitted through the data line DL, may be provided to the capacitor CPP.

The capacitor CPP may be connected to the first thin film transistor TR1 and the power line PL. The capacitor CPP may be used to store electric charges, and an amount of the electric charges stored in the capacitor CPP may be determined by a voltage difference between the data signal transmitted from the first thin film transistor TR1 and the first power voltage applied to the power line PL.

The second thin film transistor TR2 may be connected to the first thin film transistor TR1, the capacitor CPP, and the emission device ELD. The second thin film transistor TR2 may control a driving current flowing through the emission device ELD in accordance with an amount of charges stored in the capacitor CPP. A turn-on time of the second thin film transistor TR2 may be determined depending on the amount of charges stored in the capacitor CPP. During the turn-on time, the second thin film transistor TR2 may provide the first power voltage, which is transferred through the power line PL, to the emission device ELD.

The emission device ELD may generate light or control an amount of light, according to an electrical signal. For example, the emission device ELD may include an organic light emitting device, a quantum dot light emitting device, an electrophoretic device, or an electrowetting device.

The emission device ELD may be connected to the second thin film transistor TR2 and a power terminal VSS. The emission device ELD may emit light, and here, an intensity of the light emitted from the emission device ELD may be determined by a voltage difference between a signal transmitted through the second thin film transistor TR2 and a second power voltage received through the power terminal VSS. A light-emitting operation of the emission device ELD may be lasted during the turn-on time of the second thin film transistor TR2.

The emission device ELD may include a light-emitting material. Color of light to be emitted from the emission device ELD may be determined depending on the kind of the light-emitting material. The color of light to be emitted from the emission device ELD may be one of red, green, blue, and white.

However, the inventive concepts are not limited to this example or a specific embodiment, and in an embodiment, the pixel PX may include several electronic components, which can be configured and arranged in various manners.

The gate driving circuit may be disposed in the peripheral region NAA. The gate driving circuit may generate gate driving signals. The gate line GL may be connected to the gate driving circuit to transmit the gate driving signal to the pixel PX. Meanwhile, in the present embodiment, the gate driving circuit, which is mounted on the base substrate BS, may be provided. However, the inventive concepts are not limited to this example, and in some embodiments, the gate driving circuit may be provided in the form of a chip or may be mounted on an additional circuit substrate and then attached to the base substrate BS.

The input sensing unit 220 may be disposed on the display unit 210. The input sensing unit 220 may sense the external input TC and may obtain information on position and strength of the external input TC. The input sensing unit 220 may include a plurality of sensing electrodes TE1 and TE2, a plurality of sensing lines SL1 and SL2 (collectively, touch sensing lines TSL), and a plurality of terminal pads TP.

The sensing electrodes TE1 and TE2 may be disposed in the active region AA. The sensing electrodes TE1 and TE2 may include a first sensing electrode TE1 and a second sensing electrode TE2, which receive respective electrical signals different from each other. The input sensing unit 220 may obtain information on the external input TC, from a change in capacitance between the first sensing electrode TE1 and the second sensing electrode TE2.

The first sensing electrode TE1 may extend in the second direction DR2. In an embodiment, the first sensing electrodes TE1 may be arranged to be spaced apart from each other in the first direction DR1. The first sensing electrode TE1 may include a plurality of first sensing patterns SP1 and a plurality of first connection patterns BP1, which are arranged in the second direction DR2. The first sensing patterns SP1 and the first connection patterns BP1 may be alternately arranged in the second direction DR2. Each of the first connection patterns BP1 may connect two adjacent patterns of the first sensing patterns SP1.

The second sensing electrode TE2 may extend in the first direction DR1. In an embodiment, a plurality of the second sensing electrodes TE2 may be arranged to be spaced apart from each other in the second direction DR2. The second sensing electrode TE2 may include a plurality of second sensing patterns SP2 and a plurality of second connection patterns BP2, which are arranged in the first direction DR1. The second sensing patterns SP2 and the second connection patterns BP2 may be alternately arranged in the first direction DR1. Each of the second connection patterns BP2 may connect two adjacent patterns of the second sensing patterns SP2.

In the present embodiment, the first connection patterns BP1 and the second connection patterns BP2 may be disposed on different layers, whereas the first sensing patterns SP1 and the second sensing patterns SP2 may be disposed on the same layer. For example, the first connection patterns BP1 may be disposed on a layer, which is different from a layer under the second connection patterns BP2, the first sensing patterns SP1, and the second sensing patterns SP2, whereas the second connection patterns BP2, the first sensing patterns SP1, and the second sensing patterns SP2 may be disposed on the same layer.

However, the inventive concepts are not limited to this example or a specific embodiment. For example, in an embodiment, the first connection patterns BP1 may be disposed on the same layer as that under the first sensing patterns SP1 and the second sensing patterns SP2, or the first sensing electrode TE1 and the second sensing electrode TE2 may be disposed on different layers.

The sensing lines SL1 and SL2 and terminal pads TP may be disposed in the peripheral region NAA. The terminal pads TP may be connected to the sensing lines SL1 and SL2, respectively. The terminal pads TP may be electrically connected to the sensing pads PDT of the pads PD.

The sensing lines SL1 and SL2 may include a first sensing line SL1 and a second sensing line SL2. The first sensing line SL1 may connect one of the terminal pads TP, which corresponds to the first sensing electrode TE1, to the first sensing pattern SP1 and may transmit an electrical signal, which is provided from the outside, to the first sensing electrode TE1. The second sensing line SL2 may connect one of the terminal pads TP, which corresponds to the second sensing electrode TE2, to the second sensing pattern SP2 and may transmit an electrical signal, which is provided from the outside, to the second sensing electrode TE2.

Meanwhile, the pads PD may be provided in the display unit 210. The pads PD may be disposed in the pad region PA of the peripheral region NAA. In the present embodiment, the pad region PA is exemplarily illustrated to be provided in the bending portion BR.

The pads PD may include the display pads PDD and the sensing pads PDT. The display pads PDD may provide electrical signals to the display unit 210. In detail, the display pads PDD may provide electrical signals to the pixel PX and the gate driving circuit. For example, the display pads PDD may include pads, which are respectively connected to the data line DL, the power line PL, the gate driving circuit, and the power terminal VSS.

The sensing pads PDT may provide electrical signals to the input sensing unit 220. For example, the sensing pads PDT may be respectively connected to the terminal pads TP of the input sensing unit 220. This will be described in more detail below.

According to an embodiment of the inventive concepts, since the display pads PDD and the sensing pads PDT are provided in a single pad region PA, the display unit 210 and the input sensing unit 220 may be simultaneously driven through one circuit substrate 300 and thus may be easily assembled. Furthermore, it may be possible to simplify an overall process. However, the inventive concepts are not limited to this example or a specific embodiment, and in the electronic panel 200 according to an embodiment, the sensing pads PDT may be provided in the input sensing unit 220 and may be provided in a space distinct from the display pads PDP.

Referring back to FIG. 1B, the circuit substrate 300 may be connected to the electronic panel 200. The circuit substrate 300 may include a flexible substrate CF and a main substrate MB. The flexible substrate CF may include an insulating film and conductive lines mounted on the insulating film. The conductive lines may be coupled to the pads PD to electrically connect the circuit substrate 300 to the electronic panel 200. Meanwhile, in the present embodiment, the flexible substrate CF may be omitted, and in this case, the main substrate MB may be directly coupled to the electronic panel 200.

The main substrate MB may include signal lines (not shown) and electronic components (not shown). The electronic components may be coupled to the signal lines and may be electrically connected to the electronic panel 200. The electronic components may generate various electrical signals (e.g., for producing the image IM or for sensing the external input TC) or process sensed signals. In an embodiment, the main substrate MB may include a plurality of electronic components, each of which is associated to a corresponding signal to be generated or processed, but the inventive concepts are not limited to this example or a specific embodiment.

The outer case 400 may be disposed below the electronic panel 200. The outer case 400 may include a material with relatively high hardness, compared with the electronic panel 200. For example, the outer case 400 may include a plurality of frames and/or plates, each of which is formed of at least one of glass, plastic, and metallic materials.

The outer case 400 may provide a storage space. The electronic panel 200 and the circuit substrate 300 may be disposed in the storage space and may be protected from an external impact. According to an embodiment of the inventive concepts, it may be possible to realize the electronic apparatus EA providing a usage environment, in which the electronic panel 200 is used not only to display the image IM but also to sense the external input TC. Furthermore, it may be possible to reduce a thickness of the electronic apparatus EA and to more efficiently assemble the electronic apparatus EA.

Figure 3:
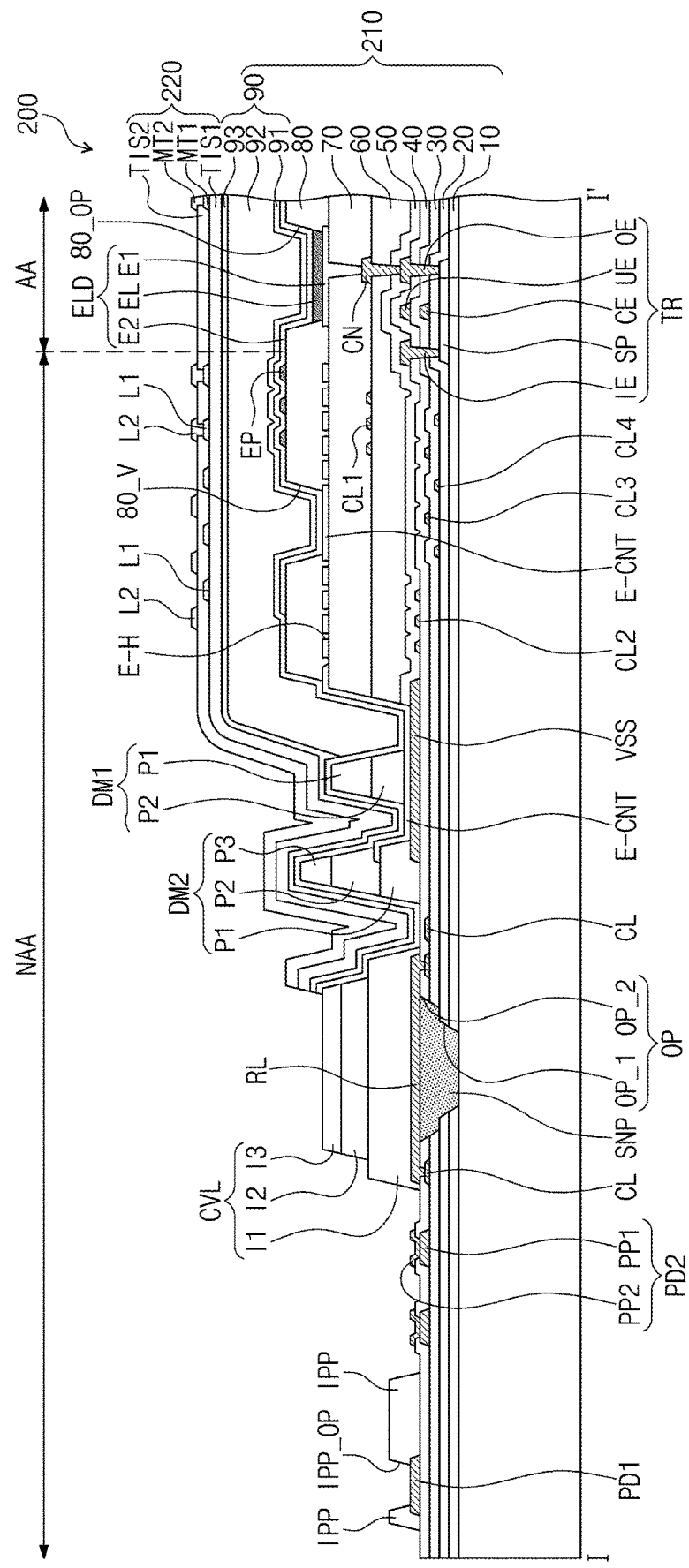
FIG. 3 is a sectional view taken along a line I-I' of FIG. 2A.

FIG. 3 is a sectional view taken along a line I-I' of FIG. 2A. Hereinafter, an embodiment of the inventive concepts will be described with reference to FIG. 3. For concise description, an element previously described with reference to FIGS. 1A to 2C may be identified by the same reference number without repeating an overlapping description thereof.

As shown in FIG. 3, the electronic panel 200 may include the display unit 210 and the input sensing unit 220. The display unit 210 may include the base substrate BS, a plurality of insulating layers 10, 20, 30, 40, 50, 60, 70, 80, and 90, a thin film transistor TR, and the emission device ELD. The thin film transistor TR and the emission device ELD may correspond to the second thin film transistor TR2 (e.g., see FIG. 2C) and the emission device ELD, which are illustrated in FIG. 2C, respectively.

The base substrate BS may include an insulating material. For example, the base substrate BS may include polyimide (PI). Thus, at least a portion of the electronic panel 200 may be easily bent or curved, as shown in FIG. 2B. However, the inventive concepts are not limited to this example, and in an embodiment, the base substrate BS may be provided as a rigid element. For example, the base substrate BS may be formed of at least one of various materials, such as glass or plastic materials, but the inventive concepts are not limited to a specific embodiment.

A first insulating layer 10 may be disposed on the base substrate BS to cover the front surface of the base substrate BS. The first insulating layer 10 may include a barrier layer and/or a buffer layer. Thus, the first insulating layer 10 may prevent oxygen or moisture, which is entered through the base substrate BS, from entering the pixel PX or may reduce a surface energy of the base substrate BS to form the pixel PX on the base substrate BS stably. However, the inventive concepts are not limited to this example or a specific embodiment, and in the electronic panel 200 according to an embodiment, at least one of the barrier and buffer layers may be omitted or may have a structure, in which a plurality of layers are stacked.

The thin film transistor TR may be disposed on the first insulating layer 10. The thin film transistor TR may include a semiconductor pattern SP, a control electrode CE, an input electrode IE, and an output electrode OE. The semiconductor pattern SP may be disposed on the first insulating layer 10. The semiconductor pattern SP may include a semiconductor material.

The control electrode CE may be spaced apart from the semiconductor pattern SP with a second insulating layer 20 interposed therebetween. The control electrode CE may be connected to the first thin film transistor TR1 (e.g., see FIG. 2C) and one electrode of the capacitor CPP (e.g., see FIG. 2C).

A third insulating layer 30 may be disposed on the control electrode CE to cover the control electrode CE. A fourth insulating layer 40 may be disposed on the third insulating layer 30 to cover the third insulating layer 30.

The input electrode IE and the output electrode OE may be disposed on the fourth insulating layer 40 and may be spaced apart from each other when viewed in a plan view. The input electrode IE and the output electrode OE of the thin film transistor TR may penetrate the second to fourth insulating layers 20, 30, and 40 and may be coupled to two opposite portions, respectively, of the semiconductor pattern SP.

Each of the second to fourth insulating layers 20, 30, and 40 may include an inorganic material and/or an organic material. For example, each of the second to fourth insulating layers 20, 30, and 40 may include silicon nitride, silicon oxide, or compounds thereof. Although each of the second to fourth insulating layers 20, 30, and 40 is illustrated to have a single-layered structure, it may have a multi-layered structure, and the inventive concepts are not limited to these examples or a specific embodiment.

Meanwhile, in the present embodiment, the thin film transistor TR may further include an upper electrode UE. The upper electrode UE may be disposed between the third insulating layer 30 and the fourth insulating layer 40. The upper electrode UE may be disposed such that it is overlapped with the control electrode CE, when viewed in a plan view. The upper electrode UE may receive a voltage different from that of the control electrode CE to produce an electric field, along with the control electrode CE, or may receive the same voltage as that of the control electrode CE to affect mobility of a channel region of the thin film transistor TR. In the thin film transistor TR according to an embodiment of the inventive concepts, the upper electrode UE may be omitted.

A fifth insulating layer 50 may be disposed on the fourth insulating layer 40 to cover the input electrode IE and the output electrode OE. The fifth insulating layer 50 may include an organic material and/or an inorganic material and may have a single-layered or stacking structure. In the present embodiment, the fifth insulating layer 50 is illustrated to be an inorganic layer.

In the thin film transistor TR, the semiconductor pattern SP may be disposed on the control electrode CE. In an embodiment, the semiconductor pattern SP may be disposed on the input electrode IE and the output electrode OE. In an embodiment, the input electrode IE and the output electrode OE may be disposed on the same layer as that under the semiconductor pattern SP and may be directly coupled to the semiconductor pattern SP. According to embodiments of the inventive concepts, the structure of the thin film transistor TR may be variously changed, and the inventive concepts are not limited to a specific embodiment.

A sixth insulating layer 60 may be disposed on the fifth insulating layer 50. A seventh insulating layer 70 may be disposed on the sixth insulating layer 60 to cover the sixth insulating layer 60. Each of the sixth insulating layer 60 and the seventh insulating layer 70 may include an inorganic material and/or an organic material. In the present embodiment, each of the sixth insulating layer 60 and the seventh insulating layer 70 is illustrated to be organic layers.

The emission device ELD may be disposed on the seventh insulating layer 70. In an embodiment, the electronic panel 200 may further include a connection electrode CN. The connection electrode CN may be disposed between the sixth insulating layer 60 and the seventh insulating layer 70. The connection electrode CN may connect the emission device ELD to the thin film transistor TR. In the electronic panel 200 according to an embodiment of the inventive concepts, the connection electrode CN may be omitted, and in this case, the emission device ELD may be directly connected to the thin film transistor TR.

The emission device ELD may include a first electrode E1, an emission layer EL, and a second electrode E2. The first electrode E1 may penetrate the seventh insulating layer 70 and may be coupled to the connection electrode CN. The first electrode E1 may receive a voltage, which is output from the thin film transistor TR, through the connection electrode CN.

An eighth insulating layer 80 may be disposed on the seventh insulating layer 70. An opening 80_OP may be defined in the eighth insulating layer 80. The opening 80_OP may expose at least a portion of the first electrode E1. The eighth insulating layer 80 may include an organic material and/or an inorganic material. In the present embodiment, the eighth insulating layer 80 is illustrated to be an organic layer. In the present embodiment, the eighth insulating layer 80 may serve as a pixel definition layer.

The emission layer EL may be disposed in the opening 80_OP and may be disposed on the first electrode E1 exposed by the opening 80_OP. The emission layer EL may include a light-emitting material. For example, the emission layer EL may be formed of at least one of light emitting materials emitting red, green, and blue lights and may include at least one of fluorescent and phosphorescent materials. The emission layer EL may be formed of or include an organic light emitting material or an inorganic light emitting material, such as quantum dots or quantum rods. The emission layer EL may emit a light in response to a potential difference between the first electrode E1 and the second electrode E2.

The second electrode E2 may be disposed on the emission layer EL. The second electrode E2 may be opposite to the first electrode E1. The second electrode E2 may be provided as a single object, which is continuously extended from the active region AA to the peripheral region NAA. The second electrode E2 may be provided in common in a plurality of pixels PX. The emission devices ELD, which are respectively disposed in the pixels PX, may receive a common second power voltage through the second electrode E2.

The second electrode E2 may be formed of or include a transparent conductive material or a transflective conductive material. Thus, light generated by the emission layer EL may easily pass through the second electrode E2 and may propagate in the third direction DR3. However, the inventive concepts are not limited to this example, and in an embodiment, the emission device ELD may be designed to have a back-side emission structure, in which the first electrode E1 includes a transparent or transflective material, or a double-side emission structure, in which light is emitted through top and bottom surfaces thereof.

Although not shown, the emission device ELD may further include a charge control layer, which is disposed between the first electrode E1 and the emission layer EL or between the second electrode E2 and the emission layer EL. The charge control layer may include a hole transport/injection material or an electron transport/injection material. Alternatively, the emission device ELD may further include a charge generation layer, which is disposed between the first electrode E1 and the emission layer EL or between the second electrode E2 and the emission layer EL. In this case, the emission layer EL may be provided in plural. The structure of the emission device ELD may be variously changed, and the inventive concepts are not limited to a specific structure of the emission device ELD.

A ninth insulating layer 90 may be disposed on the emission device ELD to encapsulate the emission device ELD. In the present embodiment, the ninth insulating layer 90 may be an encapsulation layer. The ninth insulating layer 90 may be provided as a single object, which is continuously extended from the active region AA to the peripheral region NAA. The ninth insulating layer 90 may be provided in common in a plurality of pixels PX. Although not shown, a capping layer may be further disposed between the second electrode E2 and the ninth insulating layer 90 to cover the second electrode E2.

The ninth insulating layer 90 may include a first inorganic layer 91, an organic layer 92, and a second inorganic layer 93, which are sequentially stacked in the third direction DR3. In the present embodiment, each of the first inorganic layer 91, the organic layer 92, and the second inorganic layer 93 is illustrated as single layer. However, the inventive concepts are not limited to this example or a specific embodiment, and in an embodiment, at least one of the first inorganic layer 91, the organic layer 92, and the second inorganic layer 93 may be provided as a multi-layered structure or may be omitted.

The first inorganic layer 91 may cover the second electrode E2. The first inorganic layer 91 may prevent external moisture or oxygen from entering the emission device ELD. For example, the first inorganic layer 91 may include silicon nitride, silicon oxide, or compounds thereof. The first inorganic layer 91 may be formed through a deposition process.

The organic layer 92 may be disposed on the first inorganic layer 91 and may be in contact with the first inorganic layer 91. The organic layer 92 may provide a flat surface, on the first inorganic layer 91. In detail, the organic layer 92 may provide a flat surface, in the active region AA.

The organic layer 92 may cover an uneven structure, particles, or the like, which are present on the first inorganic layer 91, and thus, elements, which are formed on the organic layer 92, may be prevented from being affected by a surface state of the top surface of the first inorganic layer 91. In addition, the organic layer 92 may relieve stress between layers that are in contact with each other. The organic layer 92 may include an organic material and may be formed by a solution process, such as a spin coating process, a slit coating process, and an inkjet process.

The second inorganic layer 93 may be disposed on the organic layer 92 to cover the organic layer 92. By virtue of the organic layer 92 having a relatively flat top surface, it may be possible to more stably form the second inorganic layer 93, compared to the case that the second inorganic layer 93 is formed on the first inorganic layer 91. The second inorganic layer 93 may encapsulate the organic layer 92 and prevent moisture in the organic layer 92 from being leaked to the outside. The second inorganic layer 93 may include silicon nitride, silicon oxide, or compounds thereof. The second inorganic layer 93 may be formed by a deposition process.

In an embodiment, the display unit 210 may further include a thin film transistor (may also be referred to as a driving transistor), a plurality of signal patterns VSS and E-CNT, a plurality of dam portions DM1 and DM2, a plurality of signal lines CL1, CL2, CL3, and CL4, the routing lines RL, the stress relieving pattern SNP, a cover pattern CVL, and a plurality of the pads PDD, which are disposed in the peripheral region NAA.

The signal patterns VSS and E-CNT may include a power pattern VSS (hereinbefore, referred to as "power terminal") and a connection electrode E-CNT. The power pattern VSS may be disposed between the fourth insulating layer 40 and the fifth insulating layer 50. In the present embodiment, the power pattern VSS is exemplarily illustrated to be disposed on the same layer as that under the input electrode IE or the output electrode OE of the thin film transistor TR. The power pattern VSS may be connected to one of the pads PDD, to which the second power signal is applied, through one of the routing lines RL and may receive the second power signal.

The connection electrode E-CNT may be disposed between the seventh insulating layer 70 and the eighth insulating layer 80. The connection electrode E-CNT and the first electrode E1 may be disposed on the same layer. The connection electrode E-CNT may be coupled to the power pattern VSS. The connection electrode E-CNT may cover the power pattern VSS exposed from the dam portions DM1 and DM2 and may be extended to be overlapped with the dam portions DM1 and DM2.

The connection electrode E-CNT may be coupled to the second electrode E2. The second electrode E2 may be coupled to the power pattern VSS through the connection electrode E-CNT and may receive the second power voltage.

Holes E-H may be defined in the connection electrode E-CNT. The holes E-H may be formed to penetrate the connection electrode E-CNT. In the case where, during the process of forming the display unit 210, gas is produced from the sixth insulating layer 60 or the seventh insulating layer 70 disposed below the connection electrode E-CNT, the gas may be easily outgassed through the holes E-H. Thus, the connection electrode E-CNT or the second electrode E2 may be stably formed on the seventh insulating layer 70. However, the inventive concepts are not limited to this example or a specific embodiment, and in an embodiment, the holes E-H may be omitted, depending on the material of the sixth or seventh insulating layer 60 or 70 or on the forming process.

In an embodiment, a recess region 80_V may be defined in the eighth insulating layer 80. The recess region 80_V may be formed by removing a portion of the eighth insulating layer 80 and may be formed to correspond to the opening 80_OP of the active region AA. In the present embodiment, the connection electrode E-CNT may be exposed through the recess region 80_V. The second electrode E2 may be coupled to the connection electrode E-CNT through the recess region 80_V. However, the inventive concepts are not limited to this example. For example, in an embodiment, the recess region 80_V may be formed at a region, which is not overlapped with the connection electrode E-CNT, and in this case, the second electrode E2 may be coupled to the connection electrode E-CNT at other position.

In the present embodiment, the recess region 80_V may provide a curved surface to upper elements. The recess region 80_V may be one possible example of a structure pattern RP to be described below. The curved surface formed by the recess region 80_V may be covered and planarized by the organic layer 92. Thus, the input sensing unit 220 may be formed on the planarized surface.

However, the inventive concepts are not limited to this example or a specific embodiment, and in an embodiment, depending on a coated amount of the organic layer 92, the curved surface formed by the recess region 80_V may be provided to the input sensing unit 220. This will be described in more detail below.

The signal lines CL1, CL2, CL3, and CL4 may include at least one of a data line, a gate line, and various control signal lines electrically connected to the active region AA. The signal lines CL1, CL2, CL3, and CL4 may transmit respective voltages in an independent manner.

The signal lines CL1, CL2, CL3, and CL4 may constitute the gate driving circuit or the signal lines CL1, CL2, CL3, and CL4 may include first to fourth signal lines CL1, CL2, CL3, and CL4. The first signal lines CL1 may be disposed between the sixth insulating layer 60 and the seventh insulating layer 70. In other words, the first signal lines CL1 may be disposed on the same layer as that under the connection electrode CN.

As described above, the routing lines RL may connect the pads PDD (e.g., see FIG. 2C) to devices or components, which are disposed in the active region AA. The routing lines RL may include at least one of signal lines connecting a first pad PD1 to the display unit 210 and connecting a second pad PD2 to the input sensing unit 220. In the present embodiment, one of the routing lines RL is exemplarily illustrated.

The routing line RL may connect a first pattern PP1, which constitutes the second pad PD2, electrically with a conductive line CL. Thus, even when a portion of the electronic panel 200 is bent, an electrical signal received through the second pad PD2 may be provided to the active region AA through the routing line RL and the conductive line CL.

The stress relieving pattern SNP may include an organic material. The stress relieving pattern SNP may be disposed in an opening OP defined in the insulating layers. For example, an opening OP_1 penetrating the first insulating layer 10 and the second insulating layer 20 may be connected to an opening OP_2 penetrating the third insulating layer 30 and the fourth insulating layer 40 to form the opening OP.

According to an embodiment of the inventive concepts, the insulating layers 10, 20, 30, 40, and 50 with relatively low flexibility may be removed from a region corresponding to the bending portion BR (e.g., see FIG. 2C) and the stress relieving pattern SNP with relatively high flexibility may be disposed there. Thus, when the bending portion BR is bent, it may be possible to reduce a bending stress exerted on the electronic panel 200. Accordingly, it may be possible to prevent the routing line RL from being damaged, when the bending portion BR is bent, and to improve reliability of the electronic panel 200. In the electronic panel 200 according to an embodiment of the inventive concepts, the bending portion BR or the stress relieving pattern SNP may be omitted, but the inventive concepts are not limited to this example or a specific embodiment.

The cover pattern CVL may be disposed on the stress relieving pattern SNP. The routing line RL may be covered with the cover pattern CVL. The cover pattern CVL may include a first layer I1, a second layer I2, and a third layer I3. The cover pattern CVL is illustrated to have a stacking structure. The cover pattern CVL may protect the stress relieving pattern SNP and the routing line RL.

The dam portions DM1 and DM2 may include a first dam portion DM1 and a second dam portion DM2. The first and second dam portions DM1 and DM2 may be sequentially arranged in a direction away from the active region AA.

The dam portions DM1 and DM2 may prevent the organic layer 92 from being overflown. Each of the dam portions DM1 and DM2 may include two layers P1 and P2 or may include three layers P1, P2, and P3. The structure of each of the dam portions DM1 and DM2 may be variously changed, but the inventive concepts are not limited to a specific embodiment.

The pads PD1 and PD2 may include the first pad PD1 and the second pad PD2. The first pad PD1 may be disposed on the fourth insulating layer 40. The first pad PD1 is illustrated to have a single-layered structure, but this is just an example. In an embodiment, the first pad PD1 may have a stacking structure including a plurality of layers, but the inventive concepts are not limited to a specific embodiment.

At least a portion of the first pad PD1 may be exposed by an insulating pattern IPP. The insulating pattern IPP may be disposed on the fourth insulating layer 40. An opening IPP OP defined in the insulating pattern IPP may expose at least a portion of the first pad PD1. The circuit substrate 300 (e.g., see FIG. 1B) may be coupled to an exposed portion of the first pad PD1 and may be electrically connected to the electronic panel 200.

The second pad PD2 may have a stacking structure, as shown. For example, the second pad PD2 may include a first pattern PP1, which is disposed on the third insulating layer 30, and a second pattern PP2, which is disposed on the fourth insulating layer 40. The second pattern PP2 may penetrate the fourth insulating layer 40 and may be coupled to the first pattern PP1. The circuit substrate 300 may be electrically connected to the electronic panel 200 through the second pattern PP2.

The first pad PD1 and the second pad PD2 may receive electrical signals, which are substantially different from each other. For example, the first pad PD1 may be one of the display pads PDD (e.g., see FIG. 2C), and the second pad PD2 may be one of the sensing pads PDT (e.g., see FIG. 2C). In an embodiment, pads for driving the input sensing unit 220 and for sensing the display unit 210 may be provided in the single electronic panel 200. Thus, it may be possible to increase an integration density of the electronic panel 200 and to reduce a thickness of the electronic apparatus EA (e.g., see FIG. 1A).

The input sensing unit 220 may include a first insulating sensing layer TIS1, a second insulating sensing layer TIS2, a plurality of first patterns MT1, and a plurality of second patterns MT2. The first patterns MT1 and the second patterns MT2 may be disposed on layers different from each other. The first patterns MT1 may be disposed between the first insulating sensing layer TIS1 and the second insulating sensing layer TIS2, and the second patterns MT2 may be disposed on the second insulating sensing layer TIS2. In the present embodiment, at least a portion of the first patterns MT1 is illustrated to be coupled to the second patterns MT2.

The first patterns MT1 and the second patterns MT2 may constitute the first sensing electrode TE1 (e.g., see FIG. 2C) and the second sensing electrode TE2 (e.g., see FIG. 2C). For example, the first patterns MT1 may constitute the first connection pattern BP1 (e.g., see FIG. 2C), and the second patterns MT2 may constitute the first and second sensing patterns SP1 and SP2 (e.g., see FIG. 2C) and the second connection pattern BP2 (e.g., see FIG. 2C). In certain embodiments, for example, the first patterns MT1 may constitute the second connection pattern BP2, and the second patterns MT2 may constitute the first and second sensing patterns SP1 and SP2 and the first connection pattern BP1. In certain embodiments, the first patterns MT1 may constitute the first and second sensing patterns SP1 and SP2 and the first connection pattern BP1, and the second patterns MT2 may constitute the second connection pattern BP2.

In certain embodiments, the first patterns MT1 may constitute the first sensing electrode TE1, and the second patterns MT2 may constitute the second sensing electrode TE2. Here, the first pattern MT1 and the second pattern MT2 may not be coupled to each other. An electronic apparatus EA according to an embodiment of the inventive concepts may include the input sensing unit 220 of various structures, but the inventive concepts are not limited to this example.

Each of the first insulating sensing layer TIS1 and the second insulating sensing layer TIS2 may include an insulating material. Each of the first insulating sensing layer TIS1 and the second insulating sensing layer TIS2 may include an organic material and/or an inorganic material. In the present embodiment, the first insulating sensing layer TIS1 is exemplarily illustrated to be an inorganic layer. Thus, the first insulating sensing layer TIS1 may provide a surface, which reflects a shape of a top surface provided by the display unit 210 (concretely, the second inorganic layer 93), to the first patterns MT1. This will be described in more detail below.

In an embodiment, the input sensing unit 220 may further include a first pattern layer L1 and a second pattern layer L2. The first pattern layer L1 and the second pattern layer L2 may be disposed in the peripheral region NAA. The first pattern layer L1 and the second pattern layer L2 may be disposed on layers different from each other. In the present embodiment, the first pattern layer L1 may be disposed on the same layer as that under the first patterns MT1, and the second pattern layer L2 may be disposed on the same layer as that under the second patterns MT2. The first pattern layer L1 and the second pattern layer L2 may constitute the sensing lines SL1 and SL2 shown in FIG. 2C. This will be described in more detail below.

According to an embodiment of the inventive concepts, at least a portion of the sensing lines SL1 and SL2 may include the first and second pattern layers L1 and L2, which are alternately arranged. The first and second pattern layers L1 and L2 may be electrically disconnected from each other, with the second insulating sensing layer TIS2 interposed therebetween. Thus, it may be possible to effectively prevent a short circuit issue from occurring between adjacent ones of the sensing lines SL1 and SL2. This will be described in more detail below.

Figure 4A:
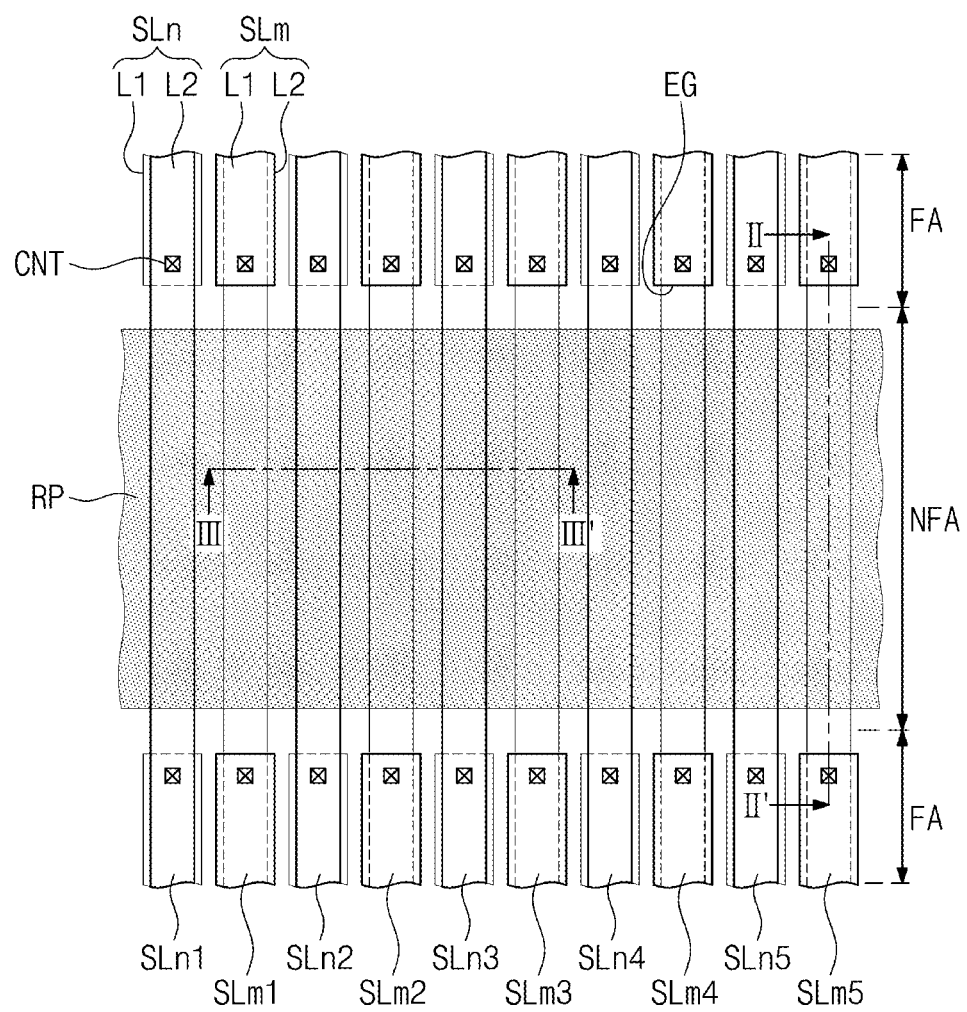
FIG. 4A is a plan view illustrating a portion of an electronic apparatus according to an exemplary embodiment of the inventive concepts.
Figure 4B:
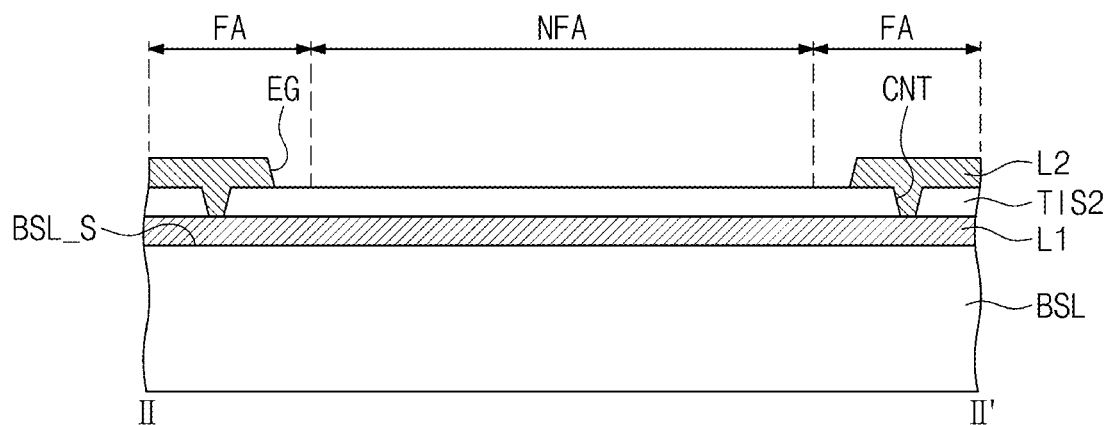
FIG. 4B is a sectional view taken along a line II-II' of FIG. 4A.
Figure 4C:
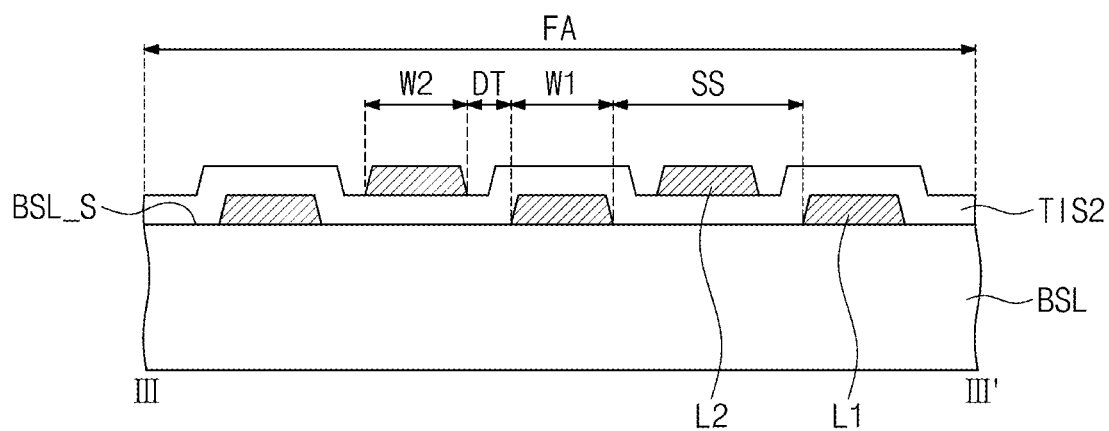
FIG. 4C is a sectional view taken along a line III-III' of FIG. 4A.

FIG. 4A is a plan view illustrating a portion of an electronic apparatus according to an embodiment of the inventive concepts. FIG. 4B is a sectional view taken along a line II-II' of FIG. 4A. FIG. 4C is a sectional view taken along a line III-III' of FIG. 4A. Hereinafter, an embodiment of the inventive concepts will be described with reference to FIGS. 4A to 4C. For concise description, an element previously described with reference to FIGS. 1A to 3 may be identified by the same reference number without repeating an overlapping description thereof.

For convenience in illustration and description, ten sensing lines SLn1, SLn2, SLn3, SLn4, SLn5, SLm1, SLm2, SLm3, SLm4, and SLm5 are illustrated in FIG. 4A. Each of the sensing lines SLn1, SLn2, SLn3, SLn4, SLn5, SLm1, SLm2, SLm3, SLm4, and SLm5 may correspond to one of the sensing lines SL1 and SL2 shown in FIG. 2C. For example, all of the ten sensing lines SLn1, SLn2, SLn3, SLn4, SLn5, SLm1, SLm2, SLm3, SLm4, and SLm5 may be the first sensing lines SL1 or may be the second sensing lines SL2. Alternatively, some of the ten sensing lines SLn1, SLn2, SLn3, SLn4, SLn5, SLm1, SLm2, SLm3, SLm4, and SLm5 may be the first sensing lines SL1, and the others may be the second sensing lines SL2.

The ten sensing lines SLn1, SLn2, SLn3, SLn4, SLn5, SLm1, SLm2, SLm3, SLm4, and SLm5 may include a first group of sensing lines SLn1, SLn2, SLn3, SLn4, and SLn5 (may be referred to as a first group of sensing lines SLn) and a second group of sensing lines SLm1, SLm2, SLm3, SLm4, and SLm5 (may be referred to as a second group of sensing lines SLm). The sensing lines SLn1, SLn2, SLn3, SLn4, and SLn5 of the first group and the sensing lines SLm1, SLm2, SLm3, SLm4, and SLm5 of the second group may be alternately arranged with respect to each other. Thus, two adjacent lines of the sensing lines may be included in the first and second groups, respectively, which are different from each other.

Each of the sensing lines SLn1, SLn2, SLn3, SLn4, and SLn5 of the first group and the sensing lines SLm1, SLm2, SLm3, SLm4, and SLm5 of the second group may be extended along a flat region FA, a non-flat region NFA, and the flat region FA.

The non-flat region NFA may be a region, which provides a relatively non-flat surface, compared with the flat region FA, to the input sensing unit 220. The non-flat region NFA may be formed by the recess region 80_V or the dam portions DM1 and DM2 described above or in a region, on which the organic layer 92 is less coated.

In the present embodiment, for convenience in illustration or description, the structure pattern RP are illustrated with hatched patterns. The structure pattern RP may be disposed in the non-flat region NFA to provide a curved surface to the input sensing unit 220. The structure pattern RP may be extended in a direction crossing an arrangement direction of the sensing lines SLn1, SLn2, SLn3, SLn4, SLn5, SLm1, SLm2, SLm3, SLm4, and SLm5. The structure pattern RP may be a convex or concave pattern.

Each of the sensing lines SLn1, SLn2, SLn3, SLn4, and SLn5 of the first group and the sensing lines SLm1, SLm2, SLm3, SLm4, and SLm5 of the second group may have a stacking structure including a plurality of layers in the flat region FA and may have a single-layered structure in the non-flat region NFA. In detail, each of the sensing lines SLn1, SLn2, SLn3, SLn4, and SLn5 of the first group and the sensing lines SLm1, SLm2, SLm3, SLm4, and SLm5 of the second group may include the first and second pattern layers L1 and L2. The first pattern layer L1 and the second pattern layer L2 may be disposed on layers different from each other.

The first pattern layer L1 may be disposed between a base layer BSL and the second insulating sensing layer TIS2. The first pattern layer L1 may substantially correspond to a first pattern layer L1 shown in FIG. 3. The base layer BSL may be a layer including the display unit 210 and the first insulating sensing layer TIS1.

The second pattern layer L2 may be disposed on the second insulating sensing layer TIS2. The second pattern layer L2 may extend in the first pattern layer L1. The second pattern layer L2 may be coupled to the first pattern layer L1 through a contact portion CNT, which is formed to penetrate the second insulating sensing layer TIS2.

When viewed in a sectional view, the first and second pattern layers L1 and L2, which constitute each of the sensing lines SLn1, SLn2, SLn3, SLn4, and SLn5 of the first group and the sensing lines SLm1, SLm2, SLm3, SLm4, and SLm5 of the second group, may be stacked, and the second insulating sensing layer TIS2 may be interposed therebetween. The first pattern layer L1 and the second pattern layer L2 may be sequentially stacked in the flat region FA, whereas only one of the first and second pattern layers L1 and L2 may be disposed in the non-flat region NFA.

In detail, each of the sensing lines SLn1, SLn2, SLn3, SLn4, and SLn5 of the first group may have a structure, in which the first and second pattern layers L1 and L2 are stacked, in the flat region FA, and may have a structure including only the second pattern layer L2, in the non-flat region NFA. A portion of the first pattern layer L1 corresponding to the non-flat region NFA may be removed to form an end portion EG in the first pattern layer L1.

Similarly, each of the sensing lines SLm1, SLm2, SLm3, SLm4, and SLm5 of the second group may have a structure, in which the first and second pattern layers L1 and L2 are stacked, in the flat region FA, and may have a structure including only the first pattern layer L1, in the non-flat region NFA. A portion of the second pattern layer L2 corresponding to the non-flat region NFA may be removed to form an end portion EG in the second pattern layer L2.

Thus, the first and second pattern layers L1 and L2 of each of the sensing lines SLn1, SLn2, SLn3, SLn4, and SLn5 of the first group and the sensing lines SLm1, SLm2, SLm3, SLm4, and SLm5 of the second group may be alternately arranged in the non-flat region NFA in a direction. In other words, a pattern, which is adjacent to the first pattern layer L1 disposed in the non-flat region NFA, may be the second pattern layer L2.

A first width W1 of the first pattern layer L1 and a second width W2 of the second pattern layer L2 may be designed in a mutually independent manner. In the present embodiment, the first width W1 and the second width W2 may be equal to each other, as shown.

The second pattern layer L2 may be disposed in a space SS between a pair of the first pattern layers L1. In the present embodiment, a distance DT between the first and second pattern layers L1 and L2 is illustrated to be uniform. In the present embodiment, the distance DT between the first and second pattern layers L1 and L2 may be equal to or larger than about 19 μm. According to an embodiment of the inventive concepts, even when the distance DT between the first and second pattern layers L1 and L2 is relatively small, since the first and second pattern layers L1 and L2 may be disposed on different layers, it may be possible to effectively prevent a short circuit issue from occurring.

According to an embodiment of the inventive concepts, the first and second pattern layers L1 and L2 may be spatially and electrically separated from each other, with the second insulating sensing layer TIS2 interposed therebetween. Thus, it may be possible to effectively prevent a short circuit issue from occurring between the sensing lines SLm1, SLm2, SLm3, SLm4, and SLm5 of the second group, each of which has the first pattern layer L1 in the non-flat region NFA, and the sensing lines SLn1, SLn2, SLn3, SLn4, and SLn5 of the first group, each of which has the second pattern layer L2 in the non-flat region NFA.

In addition, since the sensing lines SLn1, SLn2, SLn3, SLn4, and SLn5 of the first group and the sensing lines SLm1, SLm2, SLm3, SLm4, and SLm5 of the second group are alternately disposed with respect to each other, it may be possible to realize a relatively large distance between the first pattern layers L1 or the second pattern layers L2 disposed on the same layer. Thus, it may be possible to effectively reduce a short circuit issue between the sensing lines SLn1, SLn2, SLn3, SLn4, SLn5, SLm1, SLm2, SLm3, SLm4, and SLm5 and to improve reliability of the electronic apparatus EA.

Figure 5A:
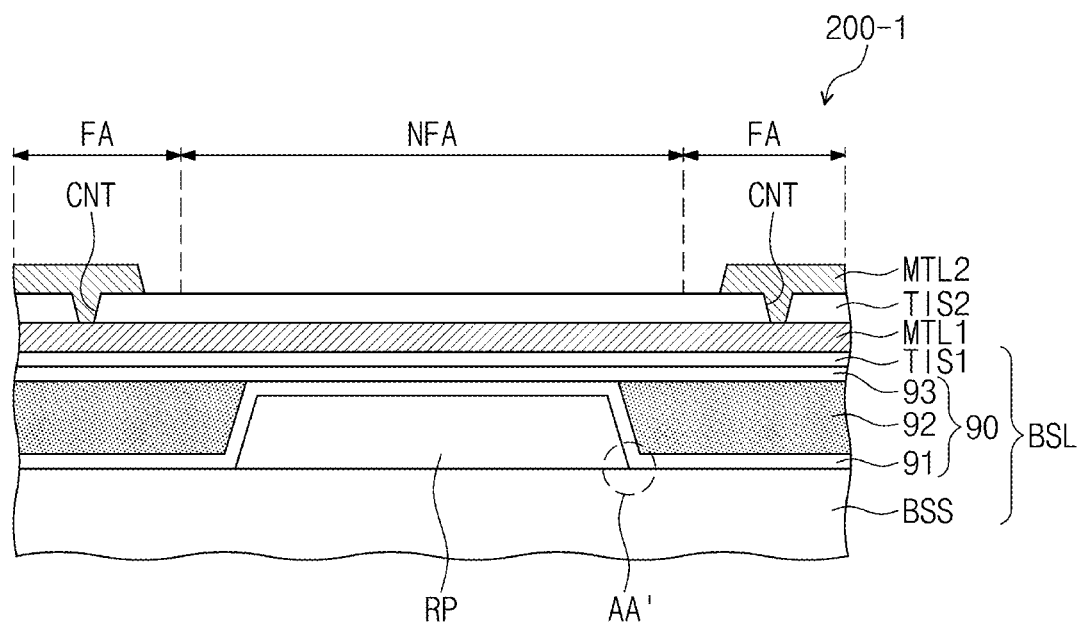
FIG. 5A is a sectional view illustrating a portion of an electronic apparatus according to an exemplary embodiment of the inventive concepts.
Figure 5B:
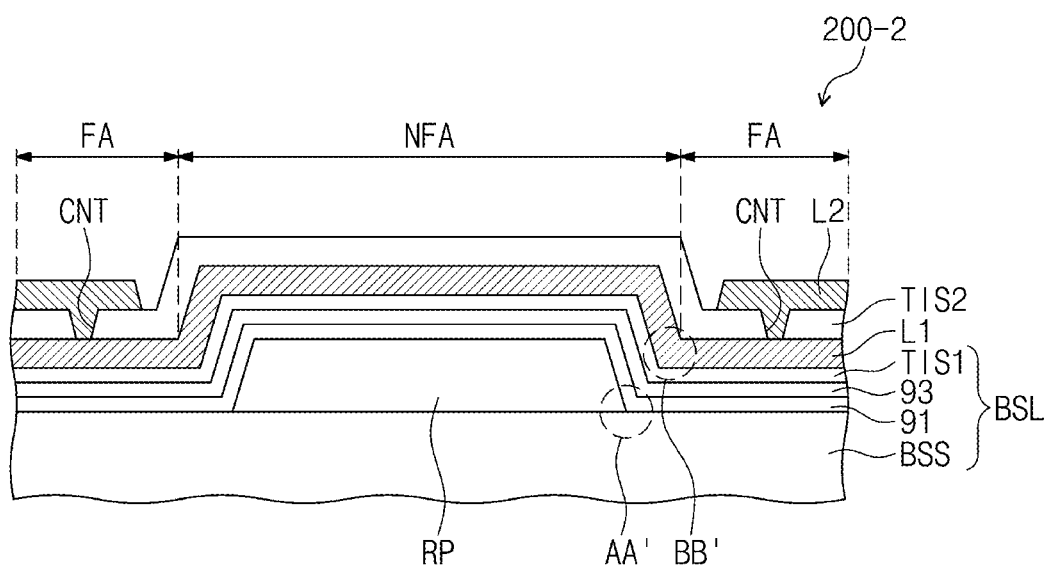
FIG. 5B is a sectional view illustrating a portion of an electronic apparatus according to an exemplary embodiment of the inventive concepts.

FIG. 5A is a sectional view illustrating a portion of an electronic apparatus according to an embodiment of the inventive concepts. FIG. 5B is a sectional view illustrating a portion of an electronic apparatus according to an embodiment of the inventive concepts. FIGS. 5A and 5B illustrate a region, which substantially corresponds to FIG. 4B. Hereinafter, an embodiment of the inventive concepts will be described with reference to FIGS. 5A and 5B.

As shown in FIG. 5A, an electronic panel 200-1 may include the base layer BSL, the first pattern layer MTL1, the second insulating sensing layer TIS2, and the second pattern layer MTL2. The base layer BSL may include a substrate BSS, the structure pattern RP, the first inorganic layer 91, the organic layer 92, the second inorganic layer 93, and the first insulating sensing layer TIS1. The first inorganic layer 91, the organic layer 92, and the second inorganic layer 93 may correspond to the first inorganic layer 91, the organic layer 92, and the second inorganic layer 93, respectively, which are shown in FIG. 3, and the substrate BSS and the structure pattern RP may include the insulating layers and the devices or components, which are disposed below the first inorganic layer 91 shown in FIG. 3. For example, the structure pattern RP may include the recess region 80_V (e.g., see FIG. 3) or the dam portions DM1 and DM2. In the present embodiment, for convenience in illustration or description, protruding patterns, such as the dam portions DM1 and DM2, are illustrated as the structure pattern RP.

A non-flat surface provided by the structure pattern RP may be covered and planarized by the organic layer 92. In the case where a coating amount of the organic layer 92 is sufficient, the organic layer 92 may fill a stepwise structure AA' between the structure pattern RP and the substrate BSS and may provide a flat top surface. Thus, the second inorganic layer 93 may be formed on the flat surface to provide a flat surface to the input sensing unit 220.

In certain embodiments, as shown in FIG. 5B, the organic layer 92 may be omitted from an electronic panel 200-2. The electronic panel 200-2 may be an embodiment, in which the organic layer 92 is formed with an amount that is less than that for the electronic panel 200-1 of FIG. 5A. Thus, the stepwise structure AA' between the structure pattern RP and the substrate BSS may be transcribed to the second inorganic layer 93 to form a stepwise structure BB' in a surface, on which the input sensing unit 220 will be provided.

The curved surface by the stepwise structure BB' may lead to a photoresist patterning failure during a process of patterning the second pattern layer L2, and thus, a photoresist residue or a residue of the second pattern layer L2 may be left after the patterning process.

In the electronic panel 200-2 according to an embodiment of the inventive concepts, even when the stepwise structure BB' is formed by the structure pattern RP, the first pattern layer L1 with the single-layered structure may be used to form the sensing line in the curved surface, and thus, it may be possible to prevent or suppress an interference issue between sensing lines, which is caused by the residue of the second pattern layer L2. Furthermore, it may be possible to increase a distance between conductive patterns disposed on the same layer. Thus, it may be possible to more effectively prevent a short circuit issue from occurring between adjacent sensing lines near the stepwise structure BB' and to improve reliability of the electronic panel 200-1 or 200-2.

Figure 6A:
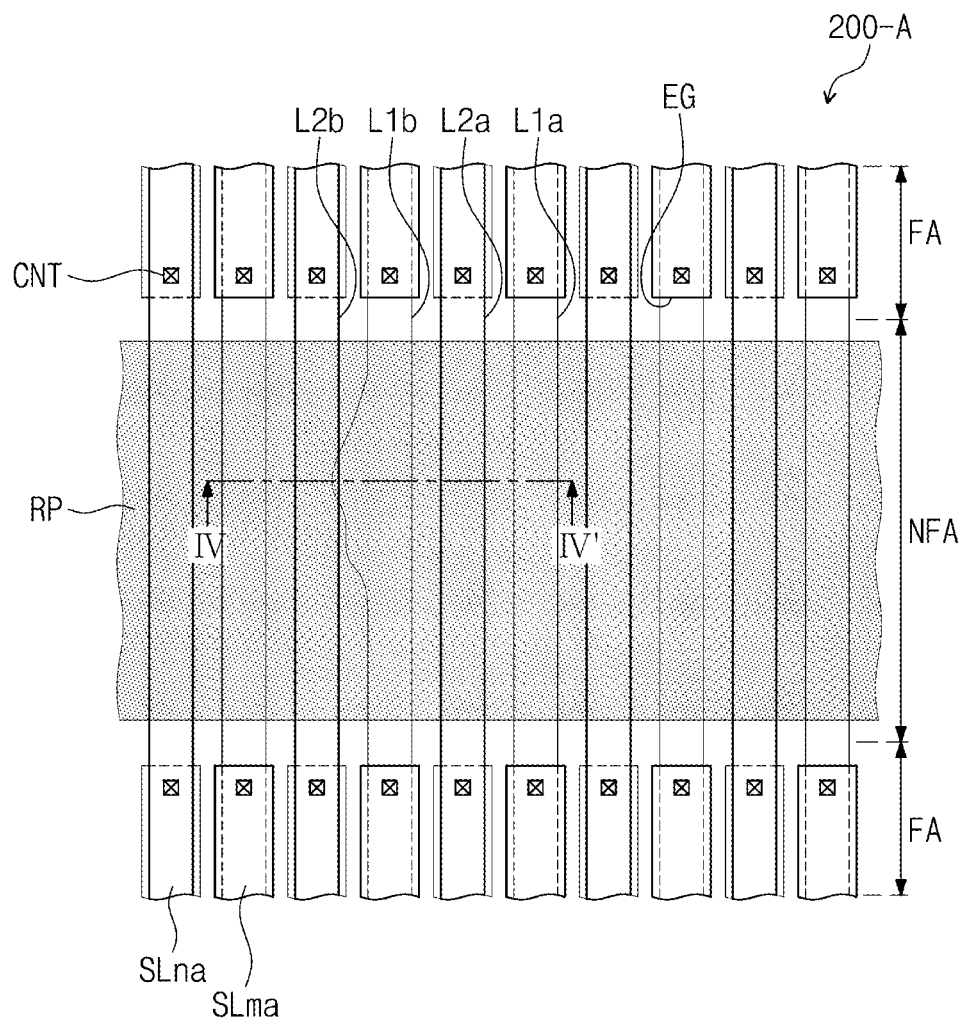
FIG. 6A is a plan view illustrating a portion of an electronic apparatus according to an exemplary embodiment of the inventive concepts.
Figure 6B:
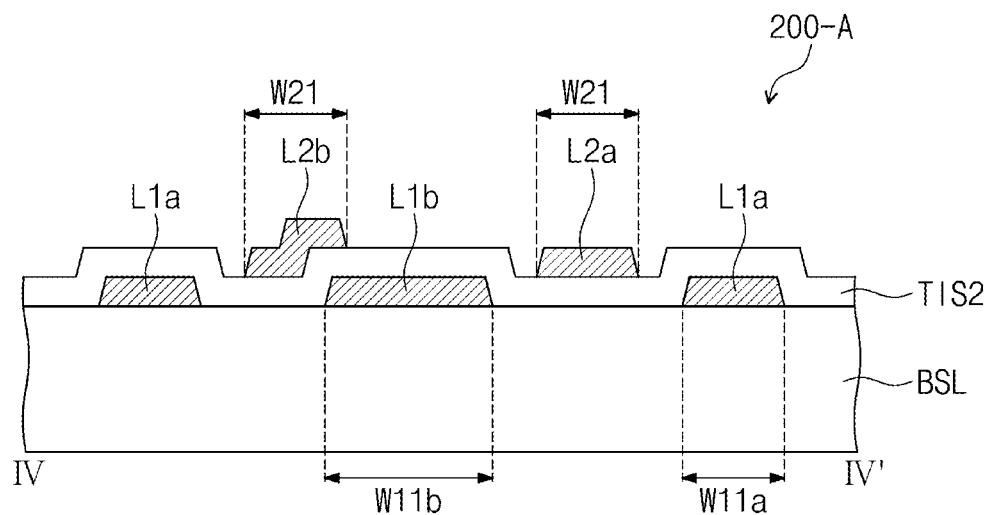
FIG. 6B is a sectional view taken along a line IV-IV' of FIG. 6A.

FIG. 6A is a plan view illustrating a portion of an electronic apparatus according to an embodiment of the inventive concepts. FIG. 6B is a sectional view taken along a line IV-IV' of FIG. 6A. The region of FIG. 6B may substantially correspond to the region shown in FIG. 4B. Hereinafter, an embodiment of the inventive concepts will be described with reference to FIGS. 6A and 6B. For concise description, an element previously described with reference to FIGS. 1A to 5B may be identified by the same reference number without repeating an overlapping description thereof.

As shown in FIG. 6A, an electronic panel 200-A may include a plurality of first group sensing lines SLna and a plurality of second group sensing lines SLma. Each of the first group sensing lines SLna and the second group sensing lines SLma may have a stacking structure composed of the first pattern layer L1a and the second pattern layer L2a, in the flat region FA, and may have a single-layered structure composed of the first pattern layer L1a or the second pattern layer L2a, in the non-flat region NFA.

Meanwhile, in the present embodiment, the first group sensing lines SLna may include the first pattern layers L1a and L1b whose widths are different from each other. In detail, the first group sensing lines SLna may be composed of the first pattern layer L1a, which has a first width W11a in the non-flat region NFA, or the first pattern layer L1b, which has a second width W11b in the non-flat region NFA. The second width W11b may be larger than the first width W11a. The first pattern layer L1b with the second width W11b may be formed when there is an unpatterning issue in the non-flat region NFA. For example, owing to the structure pattern RP, the first pattern layer L1b may be formed in the non-flat region NFA to have the second width W11b, which is larger than the first width W11a and is not uniform.

The second group sensing lines SLma may include the second pattern layers L2a and L2b in the non-flat region NFA. In FIG. 6B, a pair of the second pattern layers L2a and L2b spaced apart from each other are illustrated to have the same width (e.g., W21).

Some of the second group sensing lines SLma may be overlapped with the first pattern layer L1b with the second width W11b, when viewed in a plan view. In detail, the second group sensing lines SLma may include the second pattern layer L2a, which is disposed between the first group sensing lines SLna and in the non-flat region NFA, and the second pattern layer L2b, which is overlapped with some of the first group sensing lines SLna. Even if a distance between the second group sensing lines SLma and the first group sensing lines SLna is designed to have a constant value, some of the second group sensing lines SLma may be overlapped with the first pattern layer L1b, owing to a process error.

According to an embodiment of the inventive concepts, the second group sensing lines SLma may have a single-layered structure, which is composed of the second pattern layers L2a and L2b, in the non-flat region NFA. Thus, even if the first pattern layer L1b and the second pattern layer L2b are overlapped with each other, since the first pattern layer L1b and the second pattern layer L2b may be disposed at different layers with the second insulating sensing layer TIS2 interposed therebetween, thus, it may be possible to prevent a short circuit from being formed between the first pattern layer L1b and the second pattern layer L2b.

According to an embodiment of the inventive concepts, owing to the structure pattern RP, even when there is an error in a process of patterning sensing lines in the non-flat region NFA, it may be possible to effectively prevent a short circuit from being formed between adjacent ones of the sensing lines. This may make it possible to improve reliability of an electronic panel 200-A.

Figure 7A:
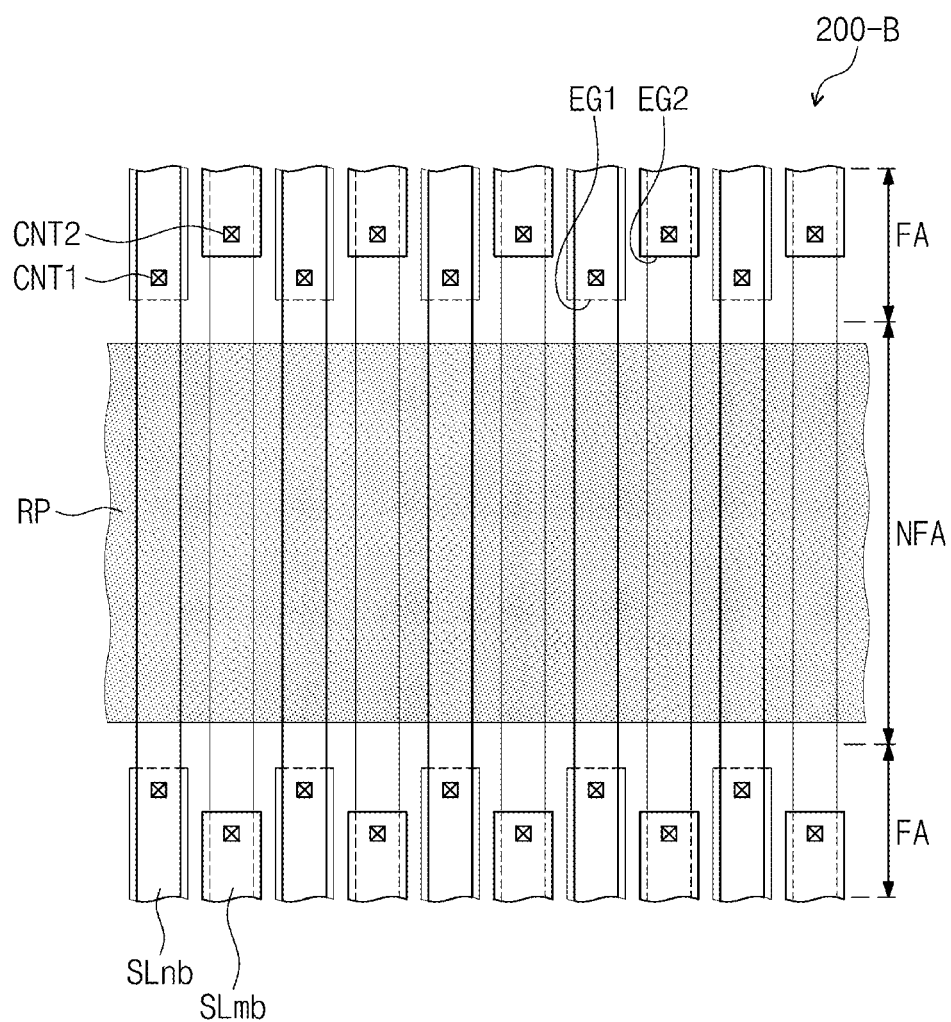
FIG. 7A is a plan view illustrating a portion of an electronic apparatus according to an exemplary embodiment of the inventive concepts.
Figure 7B:
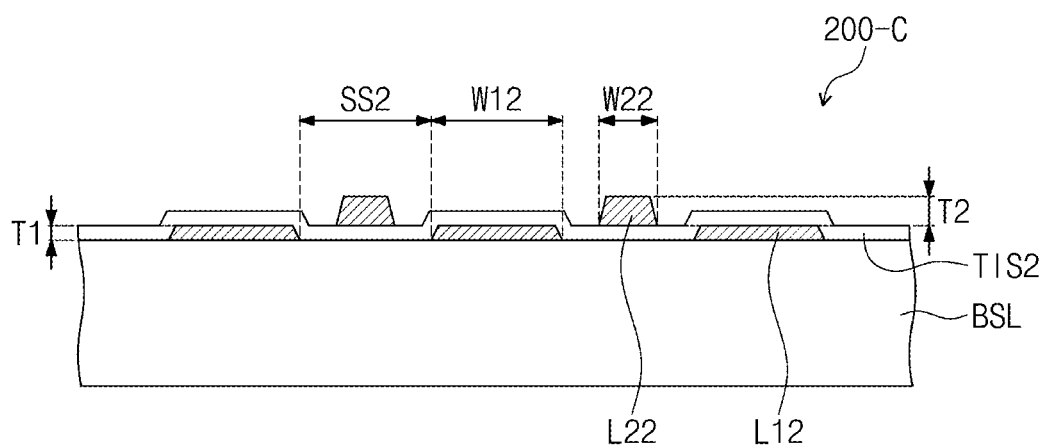
FIG. 7B is a sectional view illustrating a portion of an electronic apparatus according to an exemplary embodiment of the inventive concepts.

FIG. 7A is a plan view illustrating a portion of an electronic apparatus according to an embodiment of the inventive concepts. FIG. 7B is a sectional view illustrating a portion of an electronic apparatus according to an embodiment of the inventive concepts. The region shown in FIG. 7A may substantially correspond to the region shown in FIG. 4A. The region shown in FIG. 7B may substantially correspond to the region shown in FIG. 4C.

Hereinafter, an embodiment of the inventive concepts will be described with reference to FIGS. 7A and 7B. For concise description, an element previously described with reference to FIGS. 1A to 6B may be identified by the same reference number without repeating an overlapping description thereof.

As shown in FIG. 7A, in the electronic panel 200-B, contact portions CNT1 of sensing lines SLnb of a first group and contact portions CNT2 of sensing lines SLmb of a second group may be alternately arranged with respect to each other in a specific direction. In detail, the contact portions CNT2 of the sensing lines SLmb of the second group may be disposed further away from the non-flat region NFA, compared with the contact portions CNT1 of the sensing lines SLnb of the first group. Thus, end portions EG1 of the first pattern layer L12 of the sensing lines SLnb of the first group and end portions EG2 of the second pattern layer L22 of the sensing lines SLmb of the second group may be alternately arranged with respect to each other.

According to an embodiment of the inventive concepts, since the contact portions CNT1 and CNT2 and the end portions EG1 and EG2, which are adjacent to each other in the flat region FA, are alternately disposed with respect to each other, it may be possible to effectively suppress or prevent a short circuit issue, which may occur between adjacent patterns, owing to a process error or the like.

Alternatively, as shown in FIG. 7B, in an electronic panel 200-C, a first pattern layer L12 and a second pattern layer L22 may have shapes different from each other. The first pattern layer L12 may have a first width W12 and a first thickness T1, and the second pattern layer L22 may have a second width W22 and a second thickness T2.

The first width W12 may be larger than the second width W22, and the first thickness T1 may be smaller than the second thickness T2. According to an embodiment of the inventive concepts, by increasing a width but decreasing a thickness, it may be possible to realize a desired or designed resistance of the first pattern layer L12. Similarly, by decreasing a width but increasing a thickness, it may be possible to realize a desired or designed resistance of the second pattern layer L22. According to an embodiment of the inventive concepts, the first pattern layer L12 and the second pattern layer L22 may be designed in various shapes, according to desired resistance values thereof, but the inventive concepts are not limited to this example. In the embodiment, the first pattern layer L12 and the second pattern layer L22 may have the same resistance.

Furthermore, in the electronic panel 200-C, since the first width W12 of the first pattern layer L12 increases, a distance SS2 between the first pattern layers L12 disposed within a given area may be reduced. According to an embodiment of the inventive concepts, by increasing the second thickness T2 of the second pattern layer L22 but decreasing the second width W22, it may be possible to stably form patterns with a designed resistance within a region of the reduced distance SS2. Thus, the reliability of the electronic panel 200-C may be improved.

FIGS. 8A to 8E are sectional views illustrating a method of fabricating an electronic apparatus, according to an embodiment of the inventive concepts. For convenience in description and illustration, FIGS. 8A to 8E illustrate a fabrication process performed at a region corresponding to the region shown in FIG. 4C. Hereinafter, an embodiment of the inventive concepts will be described with reference to FIGS. 8A to 8E. For concise description, an element previously described with reference to FIGS. 1A to 7B may be identified by the same reference number without repeating an overlapping description thereof.

Figure 8A:
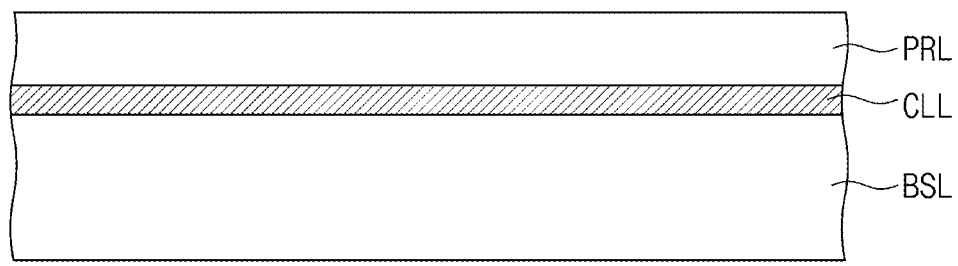
FIGS. 8A, 8B, 8C, 8D, and 8E are sectional views illustrating a method of fabricating an electronic apparatus, according to an exemplary embodiment of the inventive concepts.

As shown in FIG. 8A, a conductive layer CLL and a photoresist layer PRL may be sequentially formed on the base layer BSL. The conductive layer CLL may be formed by depositing or coating a conductive material on the base layer BSL. The photoresist layer PRL may be formed by coating a photoresist material on the conductive layer CLL.

Figure 8B:
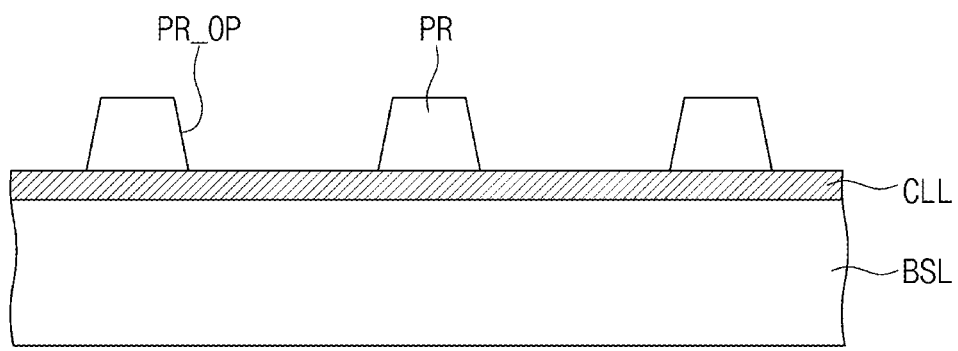

Next, as shown in FIG. 8B, the photoresist layer PRL may be patterned to form a photoresist pattern PR. The photoresist pattern PR may be formed by remove portions of the photoresist layer PRL using a mask (not shown), and as a result, openings PR_OP may be formed in the photoresist pattern PR.

Figure 8C:
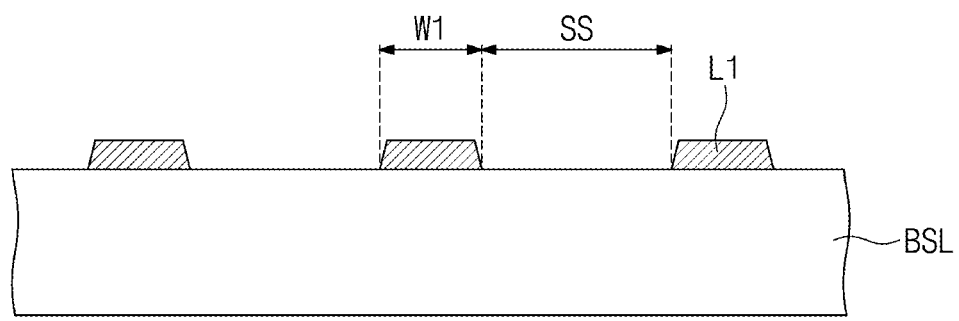

Thereafter, as shown in FIG. 8C, the conductive layer CLL may be patterned to form the first pattern layer L1. The first pattern layer L1 may be formed by removing portions of the conductive layer CLL exposed by the openings PR_OP of the photoresist pattern PR. The first pattern layer L1 may include patterns, which are spaced apart from each other in a specific distance SS, and each of which has the first width W1.

Figure 8D:
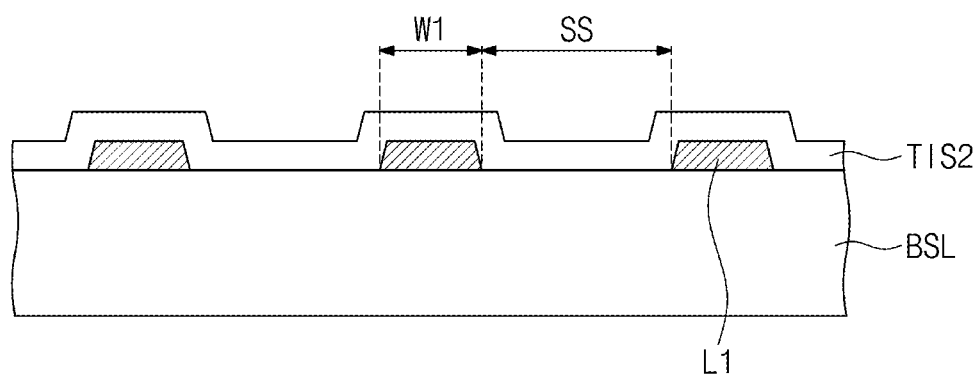

Next, as shown in FIG. 8D, the second insulating sensing layer TIS2 may be formed. The second insulating sensing layer TIS2 may be formed by depositing or coating an insulating material. The second insulating sensing layer TIS2 may be formed to cover the first pattern layer L1.

Figure 8E:
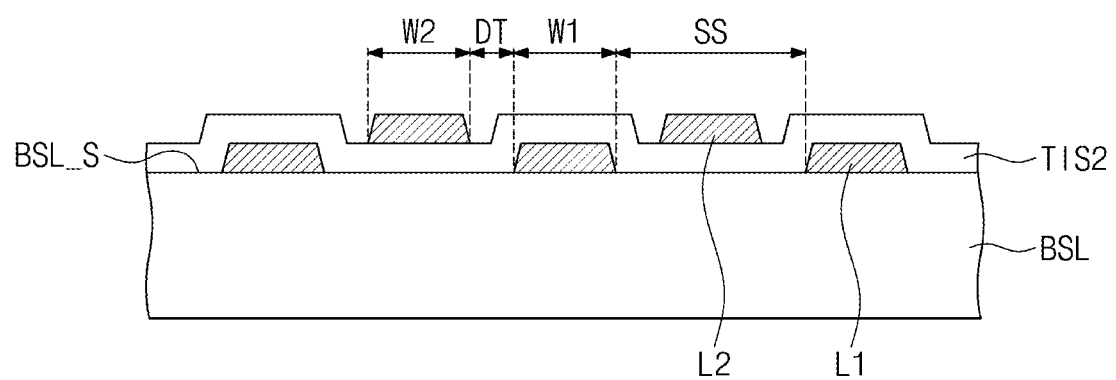

Thereafter, as shown in FIG. 8E, the second pattern layer L2 may be formed on the second insulating sensing layer TIS2. The second pattern layer L2 may be formed between the patterns of the first pattern layer L1 to have a width smaller than the distance SS of the space between the patterns, but the inventive concepts are not limited to this example. In an embodiment, the second pattern layer L2 may have the second width W2 and may be spaced apart from the first pattern layer L1 by a specific distance DT.

According to an embodiment of the inventive concepts, the first and second pattern layers L1 and L2 may be formed by different processes and may be disposed on layers different from each other. Thus, it may be possible to prevent a short circuit issue from occurring between the first and second pattern layers L1 and L2 adjacent to each other and to improve reliability of the electronic apparatus.

According to an embodiment of the inventive concepts, in an input sensing unit, it may be possible to effectively prevent a short circuit from being formed between adjacent ones of sensing lines, which are used to deliver electrical signals to sensing electrodes. Thus, even if a display unit provides a non-flat surface, the input sensing unit may be stably formed on the display unit, and thus, it may be possible to improve reliability of an electronic apparatus including the display unit and the input sensing unit.

Although certain exemplary embodiments and implementations have been described herein, other embodiments and modifications will be apparent from this description. Accordingly, the inventive concepts are not limited to such embodiments, but rather to the broader scope of the claims and various obvious modifications and equivalent arrangements as would be apparent to a person of ordinary skill in the art.

What is claimed is:

1. An electronic apparatus, comprising:
a display unit including an active region and a peripheral region adjacent to the active region; and
an input sensing unit disposed on the display unit,
wherein the input sensing unit comprises:
a plurality of sensing electrodes overlapped with the active region; and
a plurality of sensing lines disposed on the peripheral region, electrically connected to the plurality of sensing electrodes, respectively, wherein the plurality of sensing lines comprise:
first group sensing lines and second group sensing lines which are spaced apart from each other in a specific direction and are alternately arranged with respect to each other,
each of the first group sensing lines and each of the second group sensing lines includes a first pattern layer and a second pattern layer, which are spaced apart from each other with an insulating layer interposed therebetween and are coupled to each other through the insulating layer,
each of the first group sensing lines includes the first pattern layer in a specific region of the peripheral region, and each of the second group sensing lines includes the second pattern layer in the specific region.

2. The electronic apparatus of claim 1, wherein:
the first pattern layers of each of the first group sensing lines are extended in a direction crossing the specific direction to cross the specific region,
the second pattern layers of each of the first group sensing lines comprise first end portions, which are cut in the specific region,
the second pattern layers of each of the second group sensing lines are extended in a direction crossing the specific direction to cross the specific region, and
the first pattern layers of each of the second group sensing lines comprise second end portions, which are cut in the specific region.

3. The electronic apparatus of claim 2, wherein the first end portions and the second end portions are aligned in the specific direction.

4. The electronic apparatus of claim 2, wherein the first end portions are arranged to be misaligned to the second end portions in the specific direction.

5. The electronic apparatus of claim 1, wherein:
the display unit further comprises a structure pattern disposed in the specific region, and
the structure pattern which is disposed in a non-flat region to provide a curved surface to the input sensing unit comprises a plurality of extending recess regions or protruding portions.

6. The electronic apparatus of claim 5, wherein the display unit provides a non-flat surface, which corresponds to a shape of the structure pattern, to the specific region.

7. The electronic apparatus of claim 5, wherein the display unit comprises a plurality of emission devices disposed on the active region; and an encapsulation layer which covers the emission devices,
the encapsulation layer covers the structure pattern to provide a flat surface to the specific region.

8. The electronic apparatus of claim 1, wherein the first pattern layer and the second pattern layer have a same width in the specific direction.

9. The electronic apparatus of claim 1, wherein the first pattern layer and the second pattern layer have different widths from each other, in the specific direction.

10. The electronic apparatus of claim 9, wherein the first pattern layer and the second pattern layer have a same resistance.

11. The electronic apparatus of claim 1, wherein the first pattern layer of the first line and the second pattern layer of the second line are spaced apart from each other, when viewed in a plan view.

12. The electronic apparatus of claim 1, wherein the first pattern layer of the first line and the second pattern layer of the second line are partially overlapped with each other, when viewed in a plan view.

13. The electronic apparatus of claim 1, wherein each of the sensing electrodes comprises:
a first sensing electrode including a plurality of first sensing patterns and a plurality of first connection patterns connecting the first sensing patterns to each other; and a second sensing electrode including a plurality of second sensing patterns, which are spaced apart from the first sensing patterns, and a plurality of second connection patterns connecting the second sensing patterns to each other, the second connection patterns being spaced apart from the first connection patterns with an insulating layer interposed therebetween, wherein the first pattern layer and the second pattern layer are spaced apart from each other, with the insulating layer interposed therebetween.

14. An electronic panel, comprising:

a base layer includes an active region and a peripheral region adjacent to the active region;

a plurality of sensing electrodes disposed on the base layer and in the active region; and a plurality of sensing lines disposed on the base layer and in the peripheral region and electrically connected to the sensing electrodes, respectively, wherein the sensing lines comprise a plurality of first group sensing lines, which are spaced apart from each other in a specific direction, and a plurality of second group sensing lines, which are respectively disposed between the first group sensing lines and are spaced apart from each other in the specific direction of the peripheral region, each of the first group sensing lines and each of the second group sensing lines comprises a first pattern layer and a second pattern layer, which are spaced apart from each other with an insulating layer interposed therebetween and are coupled to each other through the insulating layer, each of the first group sensing lines comprises only the first pattern layer of the first and second pattern layers, in a specific region, each of the second group sensing lines comprises only the second pattern layer of the first and second pattern layers, in the specific region.

15. The electronic panel of claim 14, wherein:

the base layer comprises a structure pattern disposed in the peripheral region, and the structure pattern includes linearly extending recess portions or protruding portions extending in the specific direction and corresponding to a portion of the sensing lines, and the base layer provides a non-flat surface to the specific region.

16. The electronic panel of claim 15, wherein:

the base layer further comprises an organic layer covering the structure pattern, and the organic layer provides a flat surface to the specific region.

17. The electronic panel of claim 14, wherein the first pattern layer and the second pattern layer are spaced apart from each other, in the specific region, when viewed in a plan view.

18. The electronic panel of claim 14, wherein the first pattern layer and the second pattern layer are partially overlapped with each other, in the specific region, when viewed in a plan view.

19. The electronic panel of claim 14, wherein a coupling portion between the first pattern layer and the second pattern layer is spaced apart in the specific region of the peripheral region.

20. The electronic panel of claim 14, wherein each of the sensing electrodes comprises:

a first sensing electrode including a plurality of first sensing patterns and a plurality of first connection patterns, which are disposed between the first sensing patterns to electrically connect adjacent patterns of the first sensing patterns to each other; and a second sensing electrode including a plurality of second connection patterns, which are spaced apart from the first connection patterns with the insulating layer interposed therebetween, and a plurality of second sensing patterns, which are spaced apart from the first sensing patterns and are electrically connected to each other by the second connection patterns.

* * * * *